US012677382B2

(12) United States Patent
Shin et al.

(10) Patent No.: US 12,677,382 B2
(45) Date of Patent: Jul. 7, 2026

(54) CIRCUIT BOARD AND PACKAGE SUBSTRATE COMPRISING SAME

(71) Applicant: LG INNOTEK CO., LTD., Seoul (KR)

(72) Inventors: Jong Bae Shin, Seoul (KR); Soo Min Lee, Seoul (KR); Jae Hun Jeong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 114 days.

(21) Appl. No.: 18/271,544

(22) PCT Filed: Apr. 26, 2021

(86) PCT No.: PCT/KR2021/005273
§ 371 (c)(1),
(2) Date: Jul. 10, 2023

(87) PCT Pub. No.: WO2022/231017
PCT Pub. Date: Nov. 3, 2022

(65) Prior Publication Data
US 2024/0138077 A1     Apr. 25, 2024
US 2024/0237233 A9     Jul. 11, 2024

(51) Int. Cl.
*H05K 3/46*          (2006.01)
*H05K 1/11*          (2006.01)
*H05K 3/00*          (2006.01)

(52) U.S. Cl.
CPC ........... *H05K 3/4688* (2013.01); *H05K 1/111* (2013.01); *H05K 3/0014* (2013.01); *H05K 3/4697* (2013.01); *H05K 2201/0358* (2013.01)

(58) Field of Classification Search
CPC .... H05K 3/4688; H05K 1/111; H05K 3/0014; H05K 3/4697; H05K 2201/0358;
(Continued)

(56) References Cited

U.S. PATENT DOCUMENTS 8,772,944 B2     7/2014  Suto
8,785,788 B2     7/2014  Shimizu et al.
(Continued)

FOREIGN PATENT DOCUMENTS

CN     102593086     7/2012
CN     111148347     5/2020
(Continued)

OTHER PUBLICATIONS

U.S. Appl. No. 18/026,917 (Publiaction # 2023/0328886A).*
(Continued)

*Primary Examiner* — Timothy J Thompson
(74) *Attorney, Agent, or Firm* — KED & ASSOCIATES

(57)          ABSTRACT
A circuit board according to an embodiment includes a first insulating layer; a second insulating layer disposed on the first insulating layer and including a cavity; a pad disposed on the first insulating layer and having a top surface exposed through the cavity; wherein the cavity of the second insulating layer includes: a bottom surface positioned higher than the top surface of the first insulating layer; and an inner wall extending from the bottom surface, wherein the inner wall includes: a first inner wall extending from the bottom surface and having a first inclination angle; and a second inner wall extending from the first inner wall and having a second inclination angle different from the first inclination angle.

17 Claims, 14 Drawing Sheets

(58) Field of Classification Search
CPC .......... H05K 2201/09154; H05K 2201/09472;
H01L 23/12
See application file for complete search history.

(56) References Cited

U.S. PATENT DOCUMENTS

| | | | | |
|---|---|---|---|---|
| 9,005,456 | B2* | 4/2015 | You | H05K 3/007 |
| | | | | 174/250 |
| 10,950,587 | B2 | 3/2021 | Jeon et al. | |
| 12,144,116 | B2* | 11/2024 | Shin | H05K 3/4697 |
| 2012/0186861 | A1 | 7/2012 | Shimizu et al. | |
| 2018/0033719 | A1* | 2/2018 | Tsai | H05K 3/22 |
| 2020/0144234 | A1* | 5/2020 | Jeon | H01L 23/49822 |
| 2022/0262713 | A1* | 8/2022 | Na | H01L 23/49822 |

FOREIGN PATENT DOCUMENTS

| | | |
|---|---|---|
| JP | 2007-227430 | 9/2007 |
| JP | 2012-164952 | 8/2012 |
| KR | 10-2015-0024944 | 3/2015 |
| KR | 10-2018-0070276 | 6/2018 |
| KR | 10-2019-0104292 | 9/2019 |
| KR | 10-2021-0000105 | 1/2021 |
| KR | 10-2021-0024840 | 3/2021 |
| KR | 10-2021-0112779 | 9/2021 |

OTHER PUBLICATIONS

International Search Report dated Jan. 21, 2022 issued in Application No. PCT/KR2021/005273.
Chinese Office Action issued in Application No. 2021802094778.1 dated Mar. 27, 2026.

* cited by examiner

[FIG. 1B]

【FIG. 2A】
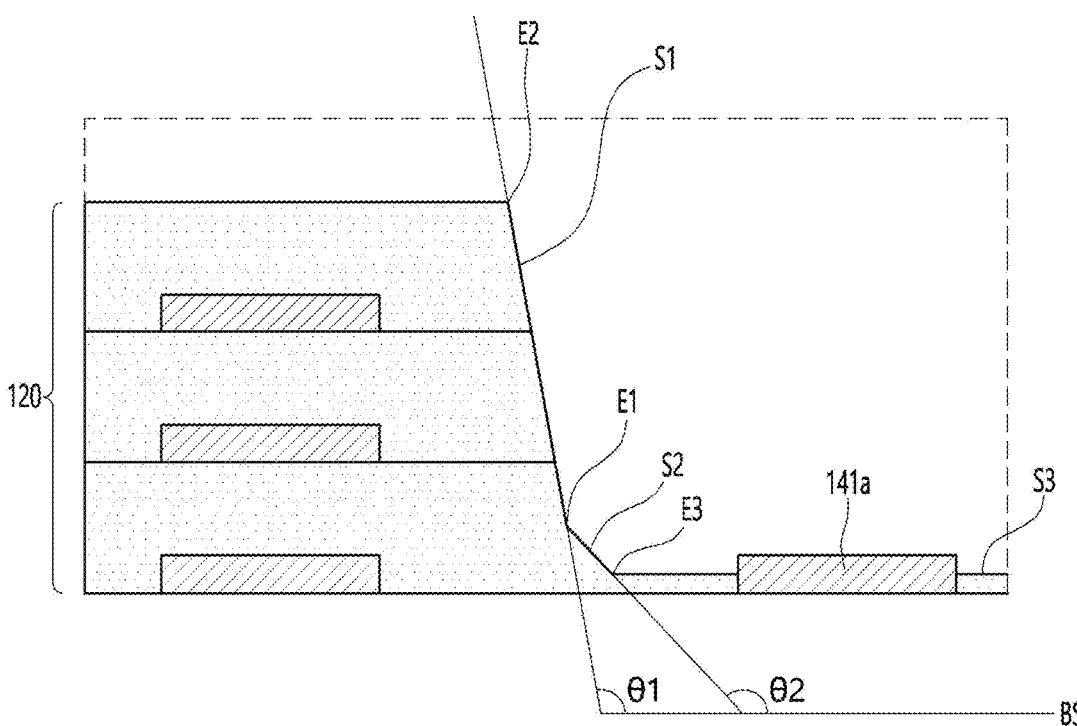

【FIG. 2B】
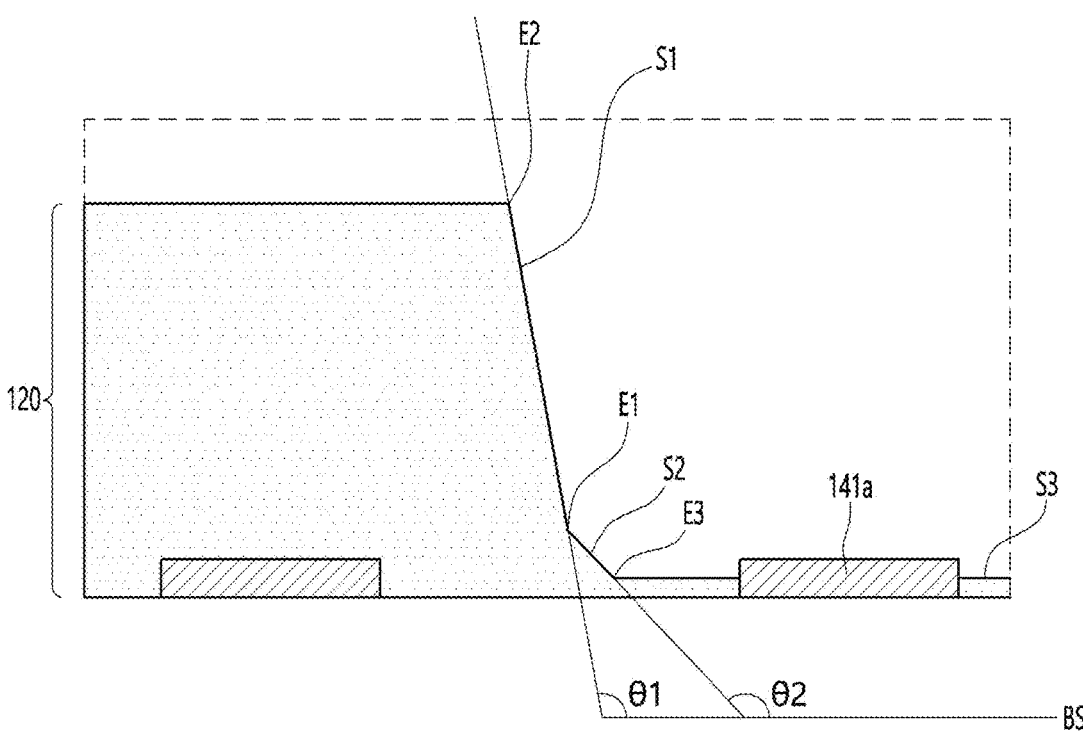

[FIG. 3]
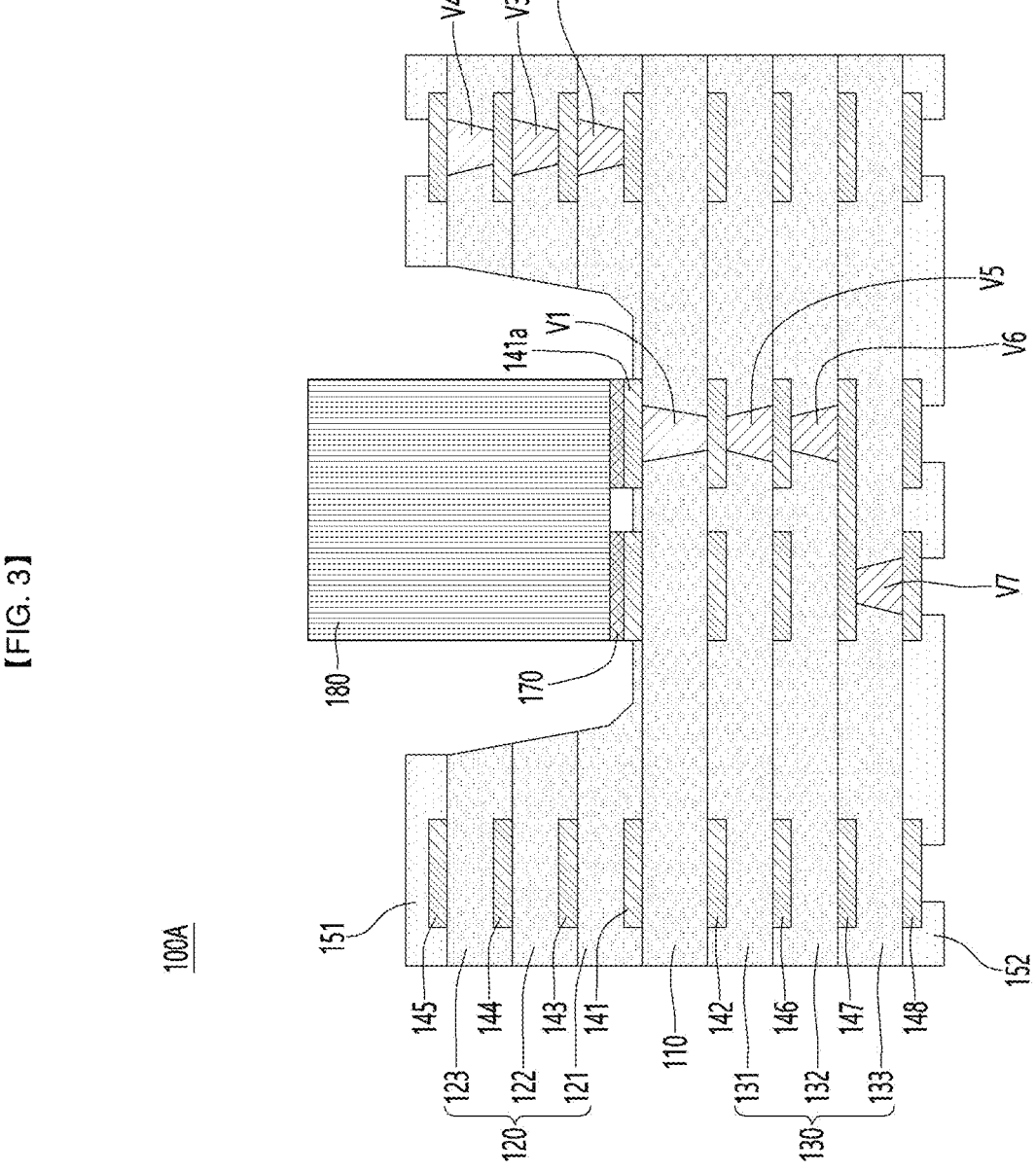

[FIG. 5]
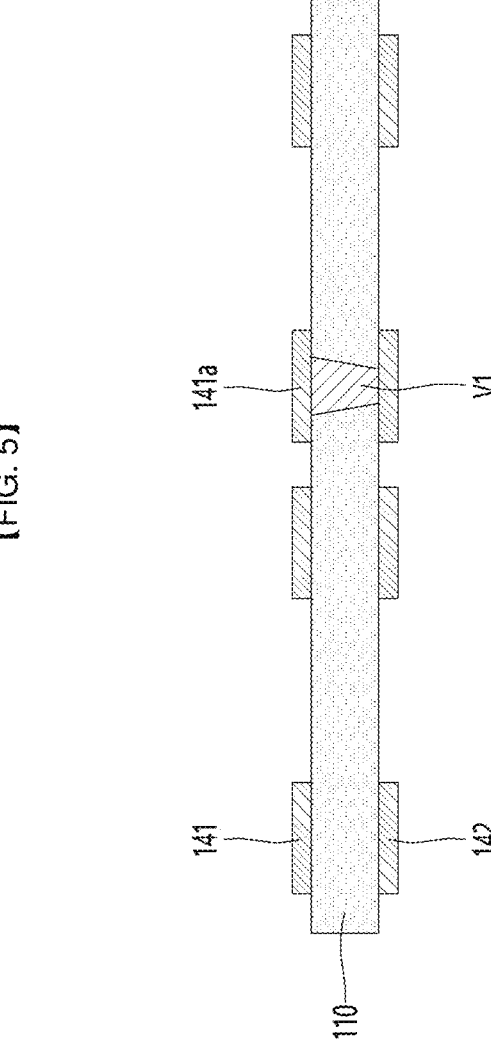

[FIG. 6]

[FIG. 7]
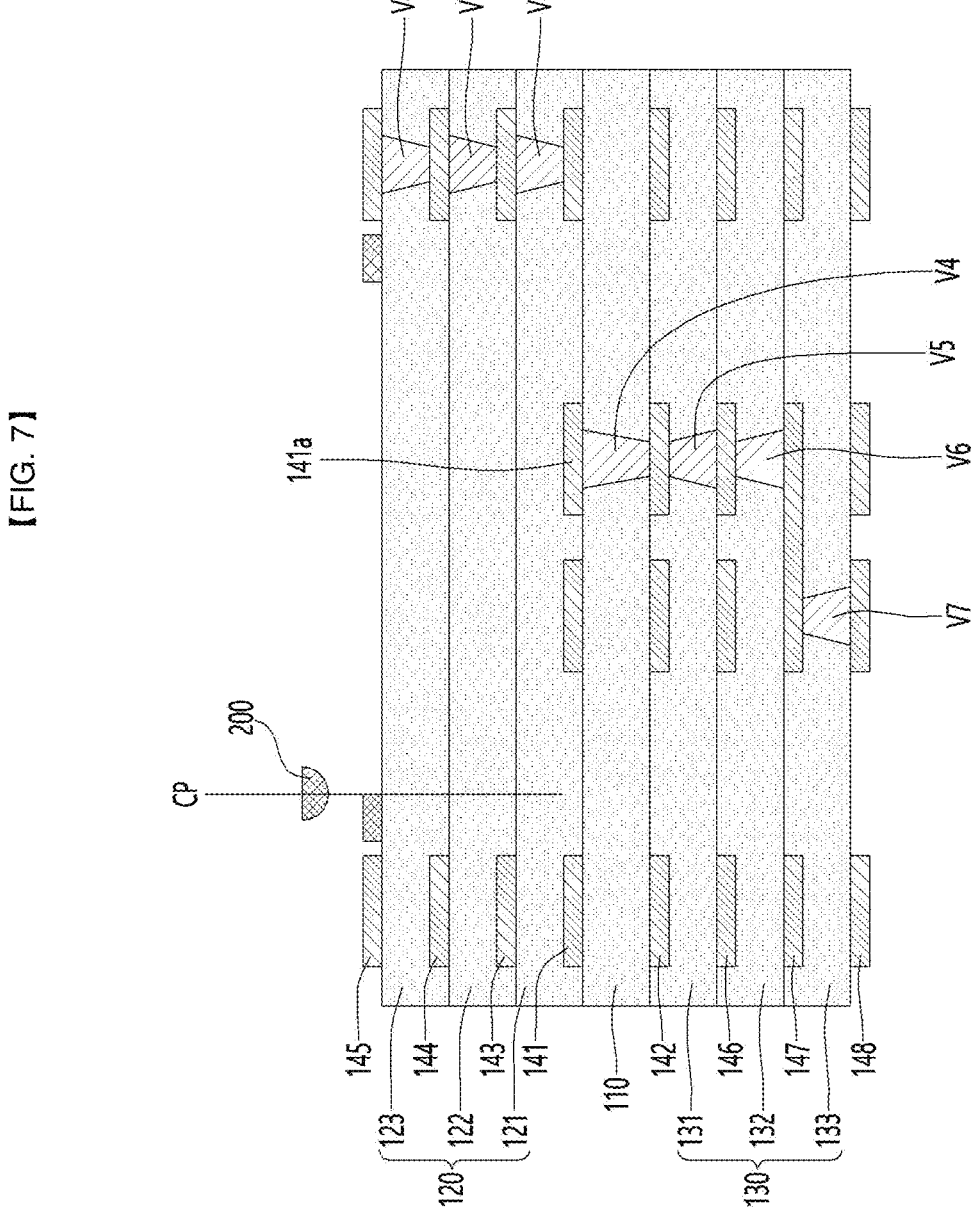

[FIG. 8]

[FIG. 9]
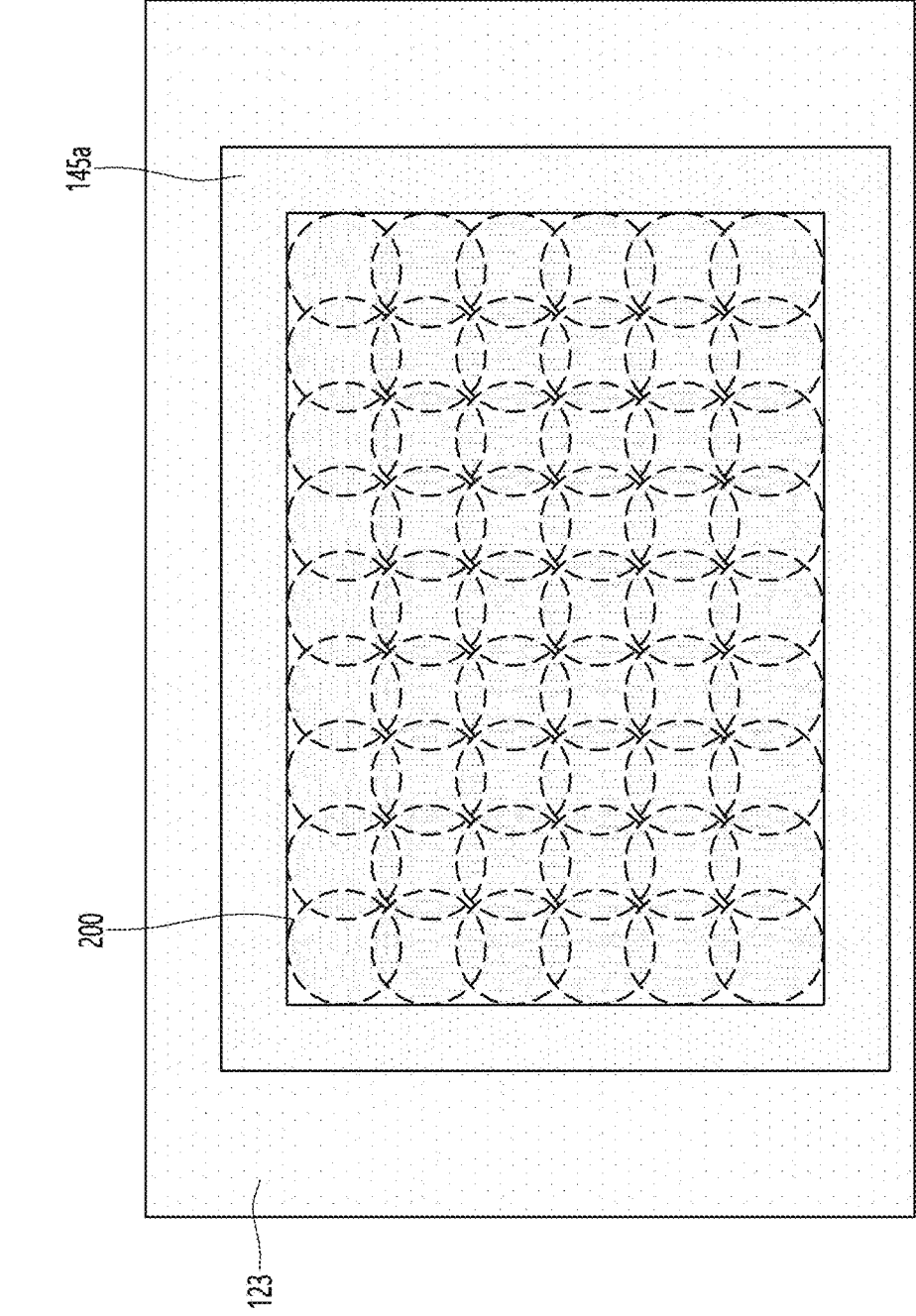

【FIG. 10】
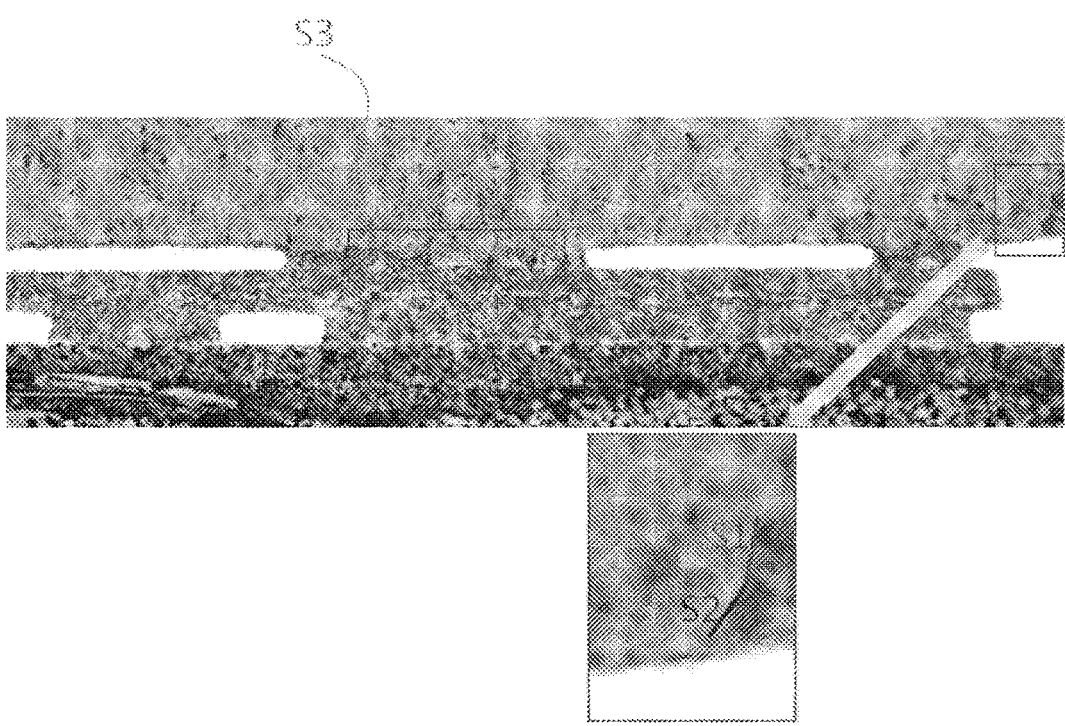
【FIG. 11】
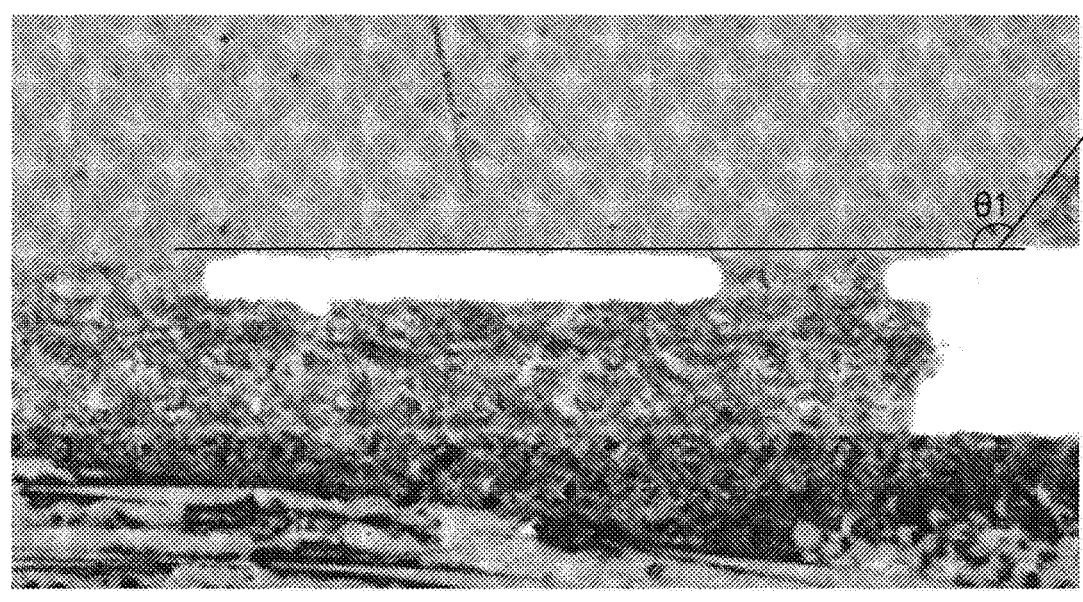

[FIG. 12]
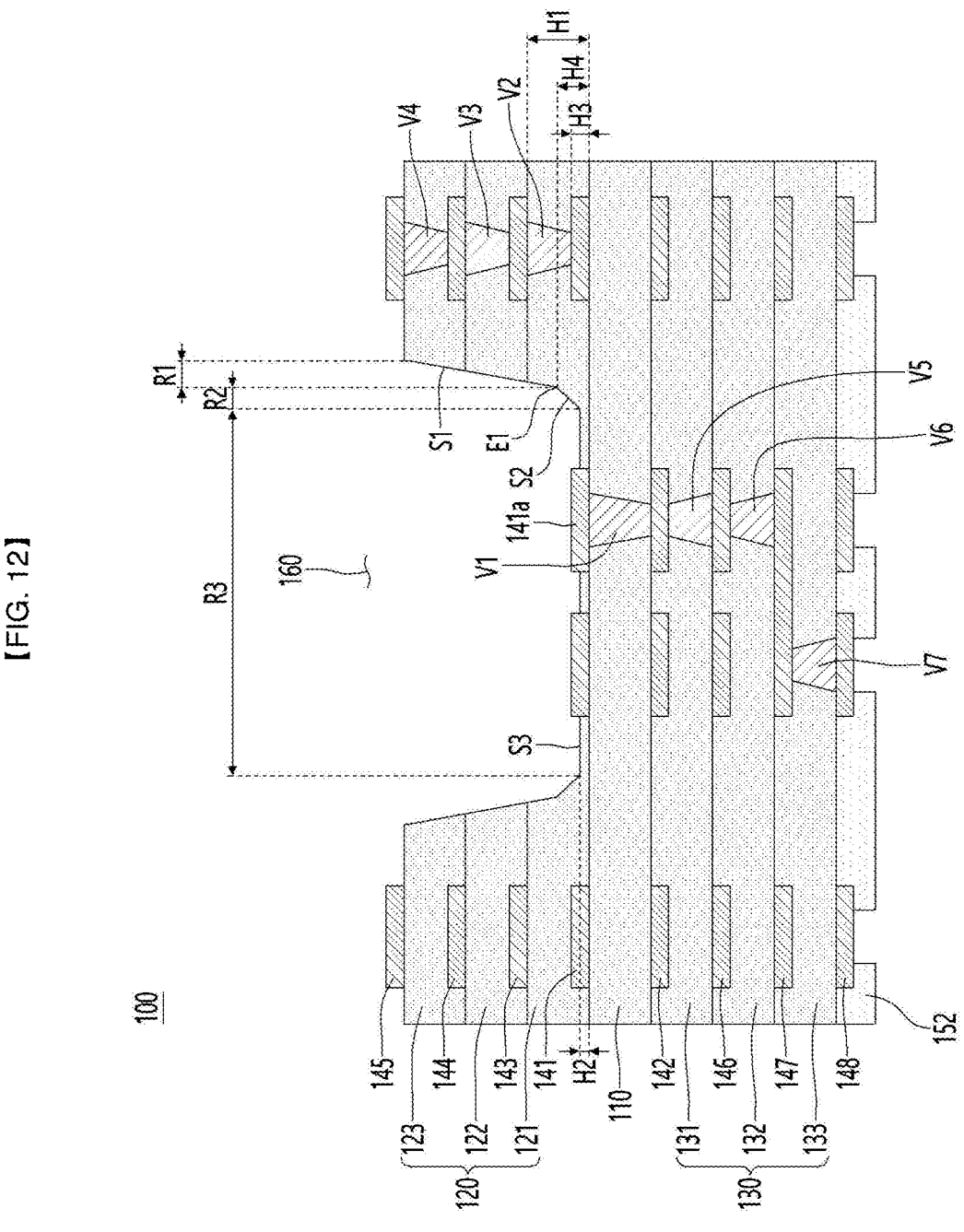

[FIG. 13]
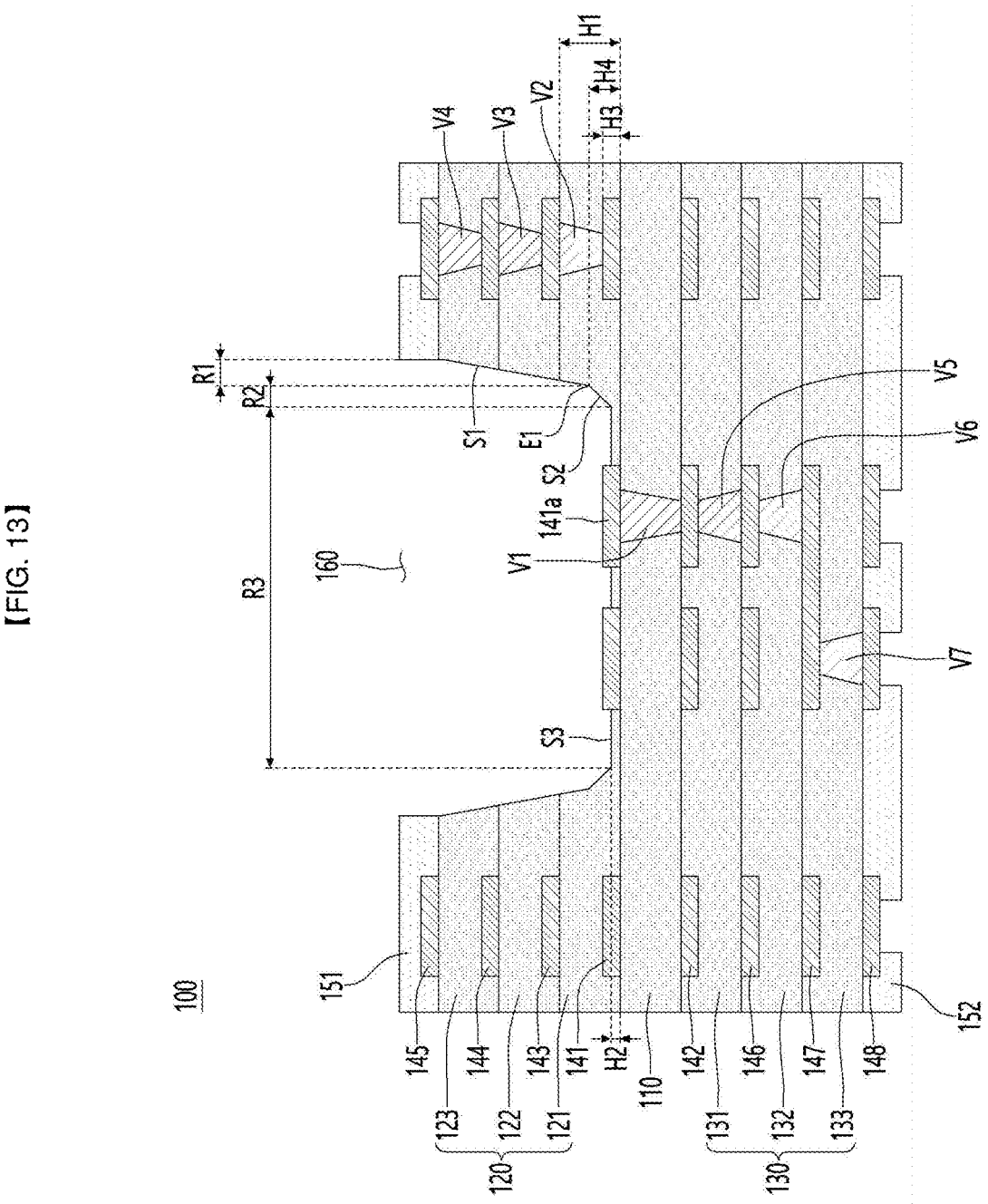

1

CIRCUIT BOARD AND PACKAGE SUBSTRATE COMPRISING SAME

CROSS-REFERENCE TO RELATED PATENT APPLICATIONS

This application is a U.S. National Stage Application under 35 U.S.C. § 371 of PCT Application No. PCT/KR2021/005273, filed Apr. 26, 2021, whose entire disclosures are hereby incorporated by reference.

TECHNICAL FIELD

The embodiment relates to a circuit board, a package substrate and a method of manufacturing the same.

BACKGROUND ART

The circuit board has a structure in which a mounting position of each element is determined in order to densely mount various kinds of elements on a flat plate and a circuit pattern connecting elements is printed on a surface of the flat plate and fixed. Such a circuit board may have an embedded structure in which the elements are embedded therein.

Recently, in order to realize miniaturization and multi-functionality of electronic components, the circuit board has been used in a multi-layered structure capable of high-density integration.

In general, a conventional embedded circuit board forms a cavity for embedding an element using a drill bit, uses an auxiliary material such as a release film for mounting the element, or uses sandblasting to form a cavity for embedding the element.

However, in a cavity included in the conventional circuit board, an inclination angle of an inner wall is formed to be 150° or more with respect to a bottom surface of the cavity. Accordingly, there is a problem that a space required for forming the cavity is relatively increased by considering the inclination angle of the inner wall in order to provide a mounting space for an element in the cavity. Accordingly, the conventional circuit board has a problem that the degree of integration of the circuit is reduced, and the overall volume of the circuit board increases as the space for forming the cavity increases.

DISCLOSURE

Technical Problem

An embodiment relates to a circuit board capable of improving an inclination angle of an inner wall of a cavity, a package substrate, and a method of manufacturing the same.

In addition, the embodiment provides a circuit board, a package substrate, and a method of manufacturing the same capable of removing a stop layer required from a bottom surface of the cavity in the process of forming the cavity.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment includes a first insulating layer; a second insulating layer disposed on the first insulating layer and including a cavity; a pad disposed on the first insulating layer and having a top surface exposed through the cavity; wherein the cavity of the second insulating layer includes: a bottom surface positioned higher than the top surface of the first insulating layer; and an inner wall extending from the bottom surface, wherein the inner wall includes: a first inner wall extending from the bottom surface and having a first inclination angle; and a second inner wall extending from the first inner wall and having a second inclination angle different from the first inclination angle.

In addition, the bottom surface of the cavity is positioned lower than the top surface of the pad.

In addition, the first inclination angle is greater than the second inclination angle.

In addition, the first inclination angle has a range of 130 degrees to 160 degrees, and the second inclination angle has a range of 130 degrees to 91 degrees.

In addition, the cavity includes an inflection point between the first inner wall and the second inner wall, and the inflection point is positioned higher than the top surface of the pad.

In addition, the second insulating layer includes: a 2-1 insulating layer disposed on the first insulating layer; and a 2-2 insulating layer disposed on the 2-1 insulating layer, wherein the cavity includes: a first part disposed in the 2-1 insulating layer; and a second part disposed in the 2-2 insulating layer, wherein the first part includes a region not passing through the 2-1 insulating layer, and wherein the second part passes through the 2-2 insulating layer.

In addition, an upper width of the cavity is greater than a lower width of the cavity.

In addition, a thickness of the second insulating layer has a range of 5 um to 20 um.

In addition, the second insulating layer includes RCC (Resin Coated Copper).

On the other hand, a package substrate according to an embodiment comprises a first insulating layer; a second insulating layer disposed on the first insulating layer and including a cavity; a pad disposed on the first insulating layer and having a top surface exposed through the cavity; a connection part disposed on the pad; and an electronic device disposed on the connection part, wherein the cavity of the second insulating layer includes: a bottom surface positioned higher than the top surface of the first insulating layer; and an inner wall extending from the bottom surface, wherein the inner wall includes: a first inner wall extending from the bottom surface and having a first inclination angle; and a second inner wall extending from the first inner wall and having a second inclination angle different from the first inclination angle.

In addition, the bottom surface of the cavity is positioned lower than the top surface of the pad.

In addition, the first inclination angle is greater than the second inclination angle.

In addition, the first inclination angle has a range of 130 degrees to 160 degrees, and the second inclination angle has a range of 130 degrees to 91 degrees.

In addition, the cavity includes an inflection point between the first inner wall and the second inner wall, and the inflection point is positioned higher than the top surface of the pad.

In addition, the package substrate further includes a molding layer disposed in the cavity and covering at least a portion of the electronic device.

On the other hand, a method of manufacturing the circuit board according to the embodiment comprises preparing a first insulating layer; forming a pad on a top surface of the first insulating layer, forming a second insulating layer covering the pad on a top surface of the first insulating layer; and forming a cavity exposing a top surface of the pad by performing a cavity forming process of opening a portion of the second insulating layer; wherein the forming the cavity includes opening the second insulating layer corresponding to an outermost portion of the cavity using a center line of a gaussian beam, wherein the cavity of the second insulating layer includes: a bottom surface positioned higher than the top surface of the first insulating layer; and an inner wall extending from the bottom surface, wherein the inner wall includes: a first inner wall extending from the bottom surface and having a first inclination angle; and a second inner wall extending from the first inner wall and having a second inclination angle different from the first inclination angle, and wherein the first inclination angle is greater than the second inclination angle.

In addition, the bottom surface of the cavity is positioned lower than the top surface of the pad.

In addition, the first inclination angle has a range of 130 degrees to 160 degrees, and the second inclination angle has a range of 130 degrees to 91 degrees.

In addition, the cavity includes an inflection point between the first inner wall and the second inner wall, and the inflection point is positioned higher than the top surface of the pad.

Advantageous Effects

According to an embodiment, the circuit board includes a cavity. In addition, the cavity of the circuit board has a non-penetrating structure rather than a structure penetrating the second insulating layer. In this case, the cavity exposes the pad disposed on a top surface of the first insulating layer. In this case, a bottom surface of the cavity is positioned lower than the top surface of the pad. Accordingly, in the embodiment, it is not necessary to form an additional stop layer on the top surface of the first insulating layer to form the cavity, and accordingly, it may omit processes such as the formation and removal of the stop layer. In addition, the embodiment may solve the reliability problem due to the change in thickness or shape of the pad that may occur in the process of removing the stop layer in the comparative example, and thereby improve product reliability.

In addition, the cavity of the circuit board of the embodiment includes a bottom surface and an inner wall. In this case, the inner wall of the cavity includes a first part extending from the bottom surface and having a first inclination angle; and a second part extending to the first part and having a second inclination angle. In this case, the first inclination angle and the second inclination angle are different from each other. In other words, the inner wall of the cavity of the embodiment may include an inflection point at which an inclination angle changes between the first part and the second part. In this case, each of the first inclination angle and the second inclination angle may mean an internal angle with the bottom surface. In addition, the first inclination angle may be smaller than the second inclination angle. Preferably, the second part of the inner wall constituting an outermost portion of the cavity of the embodiment may have a second inclination angle, and the first part of the inner wall may have a first inclination angle greater than the second inclination angle. The above embodiment can reduce the inclination angle of the second part of the inner wall compared to the comparative example, and accordingly when the same device is disposed, the embodiment may minimize a space required for forming a cavity compared to the comparative example, thereby improving circuit integration. In other words, the embodiment may reduce the inclination angle of the second portion of the inner wall, and accordingly, more circuits can be formed within the same area compared to the comparative example, and thus the overall volume of the circuit board can be reduced.

DESCRIPTION OF DRAWINGS

FIG. 1B is a view showing a circuit board according to a second embodiment.

FIG. 2A is an enlarged view of a cavity region of FIG. 1A.

FIG. 2B is an enlarged view of a cavity area of FIG. 1B.

FIG. 3 is a view showing a package substrate according to a first embodiment.

FIG. 4 is a view showing a package substrate according to a second embodiment.

FIGS. 5 to 13 are views illustrating a method of manufacturing the circuit board shown in FIG. 1A in order of process.

MODES OF THE INVENTION

Figure 1A:
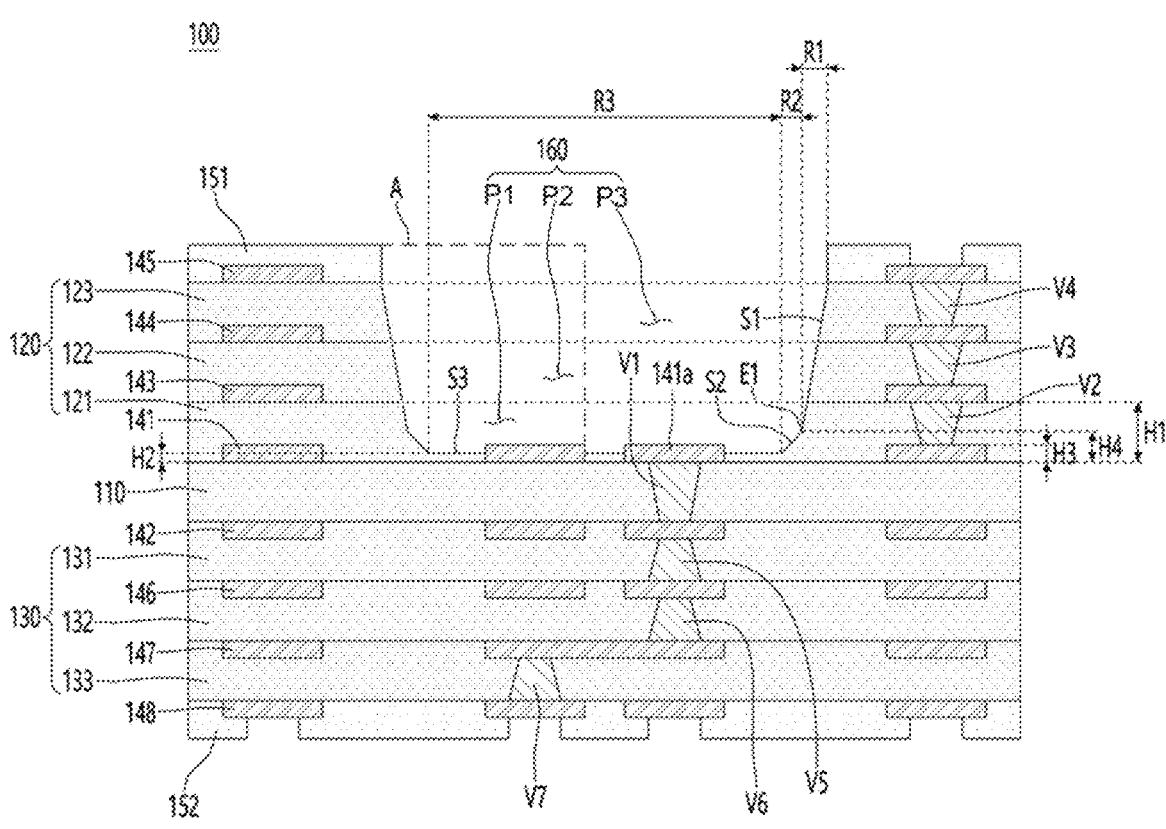
FIG. 1A is a view showing a circuit board according to a first embodiment.

Hereinafter, embodiments of the present invention will be described in detail with reference to the accompanying drawings.

However, the spirit and scope of the embodiment is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. In addition, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

Hereinafter, embodiments of the present invention will be described in detail with reference to the accompanying drawings.

Figure 1B:
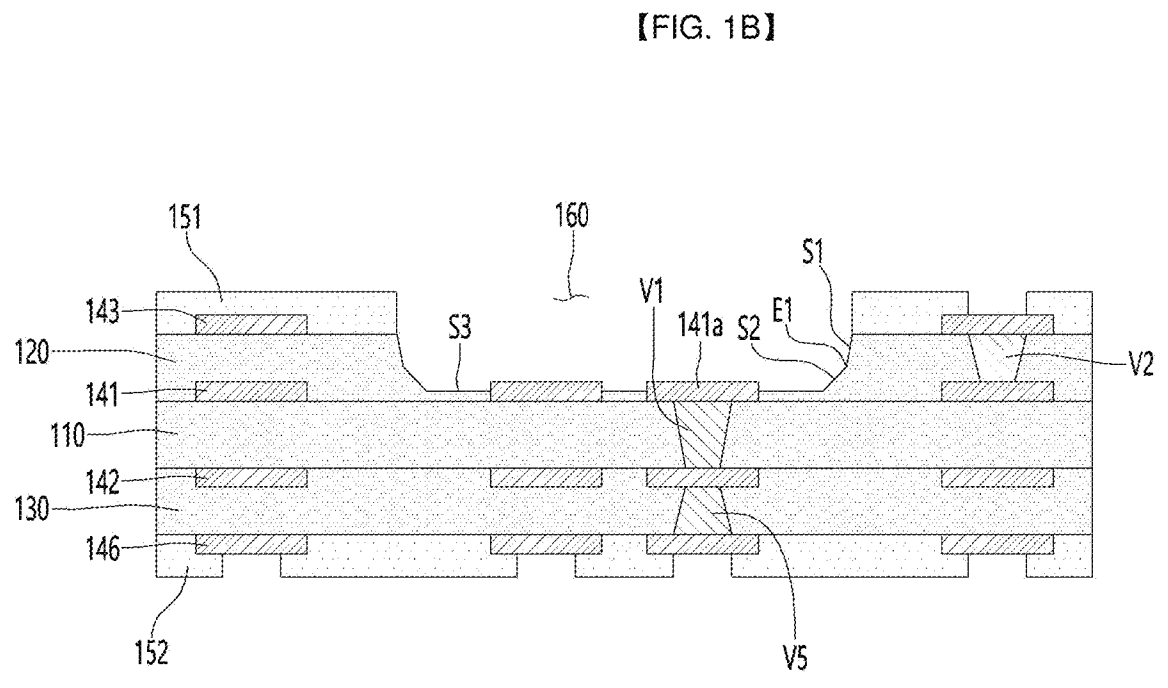

FIG. 1A is a view showing a circuit board according to a first embodiment, FIG. 1B is a view showing a circuit board according to a second embodiment, FIG. 2A is an enlarged view of a cavity region of FIG. 1A, and FIG. 2B is an enlarged view of a cavity area of FIG. 1B.

Referring to FIGS. 1A, 1B, 2A and 2B, the circuit board 100 includes a first insulating layer 110, a second insulating layer 120, a third insulating layer 130, circuit patterns 141, 142, 143, 144, 145, 146, 147, 148, vias V1, V2, V3, V4, V5, V6, V7, and protective layers 151 and 152.

The first insulating layer 110 may be an insulating layer disposed at a center of the circuit board 100.

The second insulating layer 120 is disposed on the first insulating layer 110.

In addition, the third insulating layer 130 is disposed under the first insulating layer 110.

In this case, although the first insulating layer 110 is illustrated as being disposed in a center layer in the entire stacked structure of the circuit board 100 in the drawing, the embodiment is not limited thereto. That is, the first insulating layer 110 may be disposed at a position biased toward an upper side in the entire stacked structure of the circuit board 100, or, alternatively, may be disposed at a position biased toward a lower side.

Here, referring to FIG. 1A, the second insulating layer 120 is disposed on the first insulating layer 110. In this case, the second insulating layer 120 has a structure of a plurality of layers. For example, the second insulating layer 120 may be included a second-first insulating layer 121 disposed on a top surface of the first insulating layer 110, a second-second insulating layer 122 disposed on a top surface of the second-first insulating layer 121, and a second-third insulating layer 123 disposed on a top surface of the second-second insulating layer 122. In this case, although it is illustrated that the second insulating layer 120 has a three-layer structure in the drawings, the embodiment is not limited thereto. That is, the second insulating layer 120 may be composed of two or less layers, or may be composed with a structure of four or more layers.

In addition, referring to FIG. 1A, the third insulating layer 130 is disposed under the first insulating layer 110. In this case, the third insulating layer 130 has a structure of a plurality of layers. For example, the third insulating layer 130 may include a third-first insulating layer 131 disposed under a bottom surface of the first insulating layer 110, a third-second insulating layer 132 disposed under a bottom surface of the third-first insulating layer 131, and a third-third insulating layer 133 disposed under a bottom surface of the third-second insulating layer 132. In this case, although it is illustrated that the third insulating layer 130 has a three-layer structure in the drawings, the embodiment is not limited thereto. That is, the second insulating layer 130 may be composed with two or less layers, or may be composed with a structure of four or more layers.

In addition, although the circuit board 100 is illustrated as having a seven-layer structure based on the insulating layer in the drawings, the embodiment is not limited thereto. For example, the circuit board 100 may have a number of layers of 6 or less based on the insulating layer, or may have a number of layers of 8 or more.

Meanwhile, in FIG. 1A, the second insulating layer 120 and the third insulating layer 130 have been described as having a structure of a plurality of layers, but are not limited thereto. For example, the second insulating layer 120 and the third insulating layer 130 may be composed of a single layer.

That is, as shown in FIG. 1B, one layer of the second insulating layer 120 and one layer of the third insulating layer 130 may be respectively disposed above and below the first insulating layer 110.

Accordingly, in FIG. 1A, a cavity (to be described later) is formed in the second insulating layer 120 composed of a plurality of layers, and thus the cavity may have a structure of a plurality of layers.

In addition, in FIG. 1B, a cavity may be formed in the second insulating layer 120 composed of a single layer.

That is, a difference between the first embodiment in FIG. 1A and the second embodiment in FIG. 1B is whether the second insulating layer is composed of a plurality of layers or a single layer. In addition, the difference between the first embodiment in FIG. 1A and the second embodiment in FIG. 1B is whether the cavity formed in the second insulating layer is formed by processing a plurality of layers or a single layer.

In other words, the second insulating layer 120 in the embodiment may be composed of a plurality of layers, or may be composed of a single layer. In addition, a cavity may be formed in the plurality of layers or the single layer of the second insulating layer 120.

The first insulating layer 110, the second insulating layer 120, and the third insulating layer 130 are substrates on which an electric circuit capable of changing wiring is formed, and it may include a circuit board and an insulating substrate made of an insulating material capable of forming circuit patterns on the surface thereof.

For example, the first insulating layer 110 may be rigid or flexible. For example, the first insulating layer 110 may include glass or plastic. In detail, the first insulating layer 110 may include chemically strengthened/semi-tempered glass such as soda lime glass or aluminosilicate glass, or reinforced or soft plastics such as polyimide (PI), polyethylene terephthalate (PET), propylene glycol (PPG), and polycarbonate (PC), or sapphire.

In addition, the first insulating layer 110 may include an optical isotropic film. For example, the first insulating layer 110 may include a cyclic olefin copolymer (COC), a cyclic olefin polymer (COP), an optical isotropic polycarbonate (polycarbonate, PC) or photoisotropic polymethyl methacrylate (PMMA).

In addition, the first insulating layer 110 may be bent while having a partially curved surface. That is, the first insulating layer 110 may be partially flat and partially curved while having a curved surface. In detail, the first insulating layer 110 may be curved while having a curved surface, or bent or curved while having a surface with random curvature.

In addition, the first insulating layer 110 may be a flexible substrate having a flexible property. In addition, the first insulating layer 110 may be a curved or bent substrate.

Meanwhile, the second insulating layer 120 and the third insulating layer 130 may be composed of RCC.

That is, all of the plurality of layers constituting the second insulating layer 120 and the third insulating layer 130 in the first embodiment may be composed of RCC.

In addition, each single layer constituting the second insulating layer 120 and the third insulating layer 130 in the second embodiment may be composed of RCC.

Accordingly, the second insulating layer 120 and the third insulating layer 130 may have a thickness of 5 μm to 20 μm. For example, when the second insulating layer 120 has a structure of a plurality of layers, each of the plurality of layers may have a thickness of 5 μm to 20 μm. In addition, when the second insulating layer 120 has a single layer, the thickness of the second insulating layer 120 of the single layer may be 5 μm to 20 μm.

That is, the insulating layer constituting the circuit board in the comparative example was composed of a prepreg (PPG) containing glass fibers. In this case, it is difficult to reduce the thickness of the glass fiber based on the PPG of the circuit board in the comparative example. This is because, when the thickness of the PPG decreases, the glass fiber included in the PPG may be electrically connected to a circuit pattern disposed on a surface of the PPG, and thus a crack risk is induced. Accordingly, in the case of reducing the thickness of the PPG of the circuit board in the comparative example, dielectric breakdown and damage to the circuit pattern may occur. Accordingly, the circuit board in the comparative example had a limitation in reducing the overall thickness due to the thickness of the glass fibers constituting the PPG.

Moreover, since the circuit board in the comparative example is comprised with the insulating layer only of PPG containing glass fiber, it has a high dielectric constant. However, in the case of a dielectric having a high dielectric constant, there is a problem that it is difficult to use for high frequency. That is, in the circuit board of the comparative example, since the dielectric constant of the glass fiber is high, the dielectric constant is broken in the high frequency band.

Accordingly, in the embodiment, an insulating layer is formed by using an RCC having a low dielectric constant, thereby reducing the thickness of the circuit board and providing a highly reliable circuit board in which signal loss is minimized even in a high frequency band.

Meanwhile, as the second insulating layer 120 in the embodiment is made of RCC, the thickness of the circuit board can be remarkably reduced compared to the comparative example made of PPG. Accordingly, in the embodiment, the thickness of the circuit board can be reduced by at least 5 μm compared to the comparative example by using the RCC made of the low-dielectric constant material.

However, even when using an RCC having a low dielectric constant of 2.7, which is 10% improved from the level of 3.0, which is the dielectric constant of PPG, the decrease in thickness is only 10% compared to the comparative example. Therefore, the embodiment allows it possible to provide an optimal circuit board by forming a cavity through laser processing in a part where a chip such as an electronic device is mounted.

In this case, the first insulating layer 110 expresses the electrical wiring connecting the circuit components based on the circuit design as a wiring diagram, and may reproduce an electrical conductor on insulators. In addition, at least one of the first insulating layer 110, the second insulating layer 120, and the third insulating layer 130 is equipped with an electric component, it is possible to form a wiring connecting them in a circuit, and it can mechanically fix parts other than the electrical connection function of the parts.

Circuit patterns may be disposed on surfaces of the first insulating layer 110, the second insulating layer 120, and the third insulating layer 130. For example, when the second insulating layer 120 is formed of a single layer, the circuit pattern 143 may be disposed on a top surface of the single layer of the second insulating layer 120.

For example, when the second insulating layer 120 is composed of a plurality of layers, the first circuit pattern 141 may be disposed on a top surface of the first insulating layer 110. In this case, a plurality of first circuit patterns 141 may be disposed on the top surface of the first insulating layer 110 while being spaced apart from each other by a predetermined distance.

A second circuit pattern 142 may be disposed on a bottom surface of the first insulating layer 110. A plurality of second circuit patterns 142 may be disposed on the bottom surface of the first insulating layer 110 while being spaced apart from each other by a predetermined distance.

In addition, circuit patterns may be disposed on the surface of the second insulating layer 120. For example, a plurality of third circuit patterns 143 may be disposed on a top surface of the second-first insulating layer 121 to be spaced apart from each other by a predetermined distance. In addition, a plurality of fourth circuit patterns 144 may be disposed on a top surface of the second-second insulating layer 122 to be spaced apart from each other by a predetermined distance. In addition, a plurality of fifth circuit patterns 145 may be disposed on the top surface of the second-third insulating layer 123 to be spaced apart from each other by a predetermined distance.

In addition, circuit patterns may be disposed on the surface of the third insulating layer 130. For example, when the third insulating layer 130 is formed of a single layer, the circuit pattern 146 may be disposed on a bottom surface of the third insulating layer 130 of the single layer.

In addition, when the third insulating layer 130 is composed of a plurality of layers, a plurality of sixth circuit patterns 146 may be disposed on a bottom surface of the third-first insulating layer 131 to be spaced apart from each other by a predetermined distance. In addition, a plurality of seventh circuit patterns 147 may be disposed on a bottom surface of the third-second insulating layer 132 to be spaced apart from each other by a predetermined distance. In addition, a plurality of eighth circuit patterns 148 may be disposed on a bottom surface of the third-third insulating layer 133 to be spaced apart from each other by a predetermined distance.

Meanwhile, the first to eighth circuit patterns 141, 142, 143, 144, 145, 146, 147, and 148 as described above are wirings that transmit electrical signals, and may be formed of a metal material having high electrical conductivity. To this end, the first to eighth circuit patterns 141, 142, 143, 144, 145, 146, 147, and 148 may be formed of at least one metal material selected from gold (Au), silver (Ag), platinum (Pt), titanium (Ti), tin (Sn), copper (Cu), and zinc (Zn). In addition, the first to eighth circuit patterns 141, 142, 143, 144, 145, 146, 147, and 148 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first to eighth circuit patterns 141, 142, 143, 144, 145, 146, 147, and 148 may be formed of copper (Cu), which has high electrical conductivity and is relatively inexpensive.

The first to eighth circuit patterns 141, 142, 143, 144, 145, 146, 147, and 148 may be formed by an additive process, a subtractive process, a modified semi additive process (MSAP) and a semi additive process (SAP) method, which is a typical circuit board manufacturing process, and a detailed description thereof will be omitted herein.

Meanwhile, the first circuit pattern 141 may include a pad 141a that is exposed through a cavity 160 while being disposed on the top surface of the first insulating layer 110.

The pad 141a may be electrically connected to an electronic device (described later) mounted in the cavity 160. For example, the pad 141a may be a wire bonding pad connected to an electronic device mounted in the cavity 160 through a wire. Alternatively, the pad 141a may be a flip-chip bonding pad directly connected to a terminal of an electronic device mounted in the cavity 160. This will be described in more detail below.

Meanwhile, each of the first to eighth circuit patterns 141, 142, 143, 144, 145, 146, 147, and 148 may include a pattern connected to a via for interlayer conduction, a pattern for signal transmission, and a pad connected to an electronic device and the like.

Vias V1, V2, V3, V4, V5, V6, and V7 that electrically connect circuit patterns disposed on different layers to each other may be disposed in the first insulating layer 110, the second insulating layer 120, and the third insulating layer 130. The vias V1, V2, V3, V4, V5, V6, and V7 may be disposed to pass through at least one of the first insulating layer 110, the second insulating layer 120, and the third insulating layer 130. In addition, both ends of the vias V1, V2, V3, V4, V5, V6, and V7 are respectively connected to circuit patterns disposed on different insulating layers, and thus an electrical signal may be transmitted.

A first via V1 may be disposed in the first insulating layer 110. The first via V1 may be disposed to pass through top and bottom surfaces of the first insulating layer 110. The first via V1 may electrically connects the first circuit pattern 141 disposed on the top surface of the first insulating layer 110 and the second circuit pattern 142 disposed on the bottom surface of the first insulating layer 110.

A plurality of vias may be disposed in the second insulating layer 120. That is, the second via V2 may be disposed in the second-first insulating layer 121. The second via V2 may be electrically connected the first circuit pattern 141 disposed on the top surface of the first insulating layer 110 and the third circuit pattern 143 disposed on the top surface of the second-first insulating layer 121.

In addition, a third via V3 may be disposed in the second-second insulating layer 122. The third via V3 may be electrically connected the fourth circuit pattern 144 disposed on the top surface of the second-second insulating layer 122 and the third circuit pattern 143 disposed on the top surface of the second-first insulating layer 121.

In addition, a fourth via V4 may be disposed in the second-third insulating layer 123. The fourth via V4 may be electrically connected the fifth circuit pattern 145 disposed on the top surface of the second-third insulating layer 123 and the fourth circuit pattern 144 disposed on the top surface of the second-second insulating layer 122.

In addition, when the second insulating layer 120 is formed of a single layer, only the second via V2 may be disposed in the single layer of the second insulating layer 120.

A plurality of vias may be disposed in the third insulating layer 130. That is, a fifth via V5 may be disposed in the third-first insulating layer 131. The fifth via V5 may be electrically connected the second circuit pattern 142 disposed on the bottom surface of the first insulating layer 110 and the sixth circuit pattern 146 disposed on the bottom surface of the third-first insulating layer 131.

In addition, a sixth via V6 may be disposed in the third-second insulating layer 132. The sixth via V6 may be electrically connected the seventh circuit pattern 147 disposed on the bottom surface of the third-second insulating layer 132 and the sixth circuit pattern 146 disposed on the bottom surface of the third-first insulating layer 131.

In addition, a seventh via V7 may be disposed in the third-third insulating layer 133. The seventh via V7 may be electrically connected the eighth circuit pattern 148 disposed on the bottom surface of the third-third insulating layer 133 and the seventh circuit pattern 147 disposed on the bottom surface of the third-second insulating layer 132.

In addition, when the third insulating layer 130 is formed of a single layer, only the third via V3 may be disposed in the single layer of the second insulating layer 120.

Meanwhile, the vias V1, V2, V3, V4, V5, V6, and V7 may pass through only one insulating layer among the first insulating layer 110, the second insulating layer 120, and the third insulating layer 130, or alternatively, may be disposed while passing through a plurality of insulating layers in common. Accordingly, the vias V1, V2, V3, V4, V5, V6, and V7 may connect circuit patterns disposed on the surface of the insulating layer that are at least two or more apart from each other, rather than the neighboring insulating layers.

Meanwhile, the vias V1, V2, V3, V4, V5, V6, and V7 may be formed by filling the inside of a through hole (not shown) passing through at least one insulating layer among the plurality of insulating layers with a conductive material.

The through hole may be formed by any one of machining methods, including mechanical, laser, and chemical processing. When the through hole is formed by mechanical processing, methods such as milling, drilling, and routing may be used, and when the through hole is formed by laser processing, a UV or $CO_2$ laser method may be used, and when the through hole is formed by chemical processing, drugs containing amino silane, ketones, etc. may be used, and the like, thereby at least one insulating layer among the plurality of insulating layers may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

In addition, the processing by the laser can have a cutting diameter of at least 0.005 mm, and has a wide advantage in a range of possible thicknesses.

As the drill for the laser processing, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

When the through hole is formed, the vias V1, V2, V3, V4, V5, V6, and V7 may be formed by filling the inside of the through hole with a conductive material. Metal materials forming the vias V1, V2, V3, V4, V5, V6, and V7 may be any one material selected from Cu, Ag, Sn, Au, Ni, and Pd, and the metal material may be filled using any one or a combination of electroless plating, electrolytic plating, screen printing, sputtering, evaporation, ink jetting and dispensing.

Meanwhile, protective layers 151 and 152 may be disposed on the surface of an outermost insulating layer among the first insulating layer 110, the second insulating layer 120, and the third insulating layer 130. For example, the first protective layer 151 may be disposed on the top surface of the insulating layer disposed on the uppermost of the plurality of insulating layers. For example, the first protective layer 151 may be disposed on the top surface of the second-third insulating layer 123 disposed on the uppermost portion of the second insulating layer 120. In addition, a second protective layer 152 may be disposed on a bottom surface of the insulating layer disposed at the lowermost portion among the plurality of insulating layers. For example, the second protective layer 152 may be disposed on a bottom surface of the third-third insulating layer 133 disposed at the lowermost portion of the third insulating layer 130.

In addition, when the second insulating layer 120 and the third insulating layer 130 are each composed of a single layer, the first protective layer 151 may be disposed at the top surface of the second insulating layer 120, and the second protective layer 152 may be disposed at the lower surface of the third insulating layer 130.

The first protective layer 151 and the second protective layer 152 may each have an opening. For example, the first protective layer 151 may have an opening exposing the surface of the fifth circuit pattern to be exposed among the fifth circuit patterns 145 disposed on the top surface of the second-third insulating layer 123.

In addition, the second protective layer 152 may have an opening exposing the surface of the eighth circuit pattern to be exposed among the eighth circuit patterns 148 disposed on the bottom surface of the third-third insulating layer 133.

The first protective layer 151 and the second protective layer 152 may include an insulating material. The first protective layer 151 and the second protective layer 152 may include various materials that can be cured by heating after being applied to protect the surface of the circuit patterns. The first protective layer 151 and the second protective layer 152 may be resist layers. For example, the first protective layer 151 and the second protective layer 152 may be a solder resist layer including an organic polymer material. For example, the first protective layer 151 and the second protective layer 152 may include an epoxy acrylate-based resin. In detail, the first protective layer 151 and the second protective layer 152 may include a resin, a curing agent, a photo initiator, a pigment, a solvent, a filler, an additive, an acryl-based monomer, and the like. However, the embodiment is not limited thereto, and the first protective layer 151 and the second protective layer 152 may be any one of a photo solder resist layer, a cover-lay, and a polymer material.

A thickness of the first protective layer 151 and the second protective layer 152 may be 1 μm to 20 μm. The thickness of the first protective layer 151 and the second protective layer 152 may be 1 μm to 15 μm. For example, the thickness of the first protective layer 151 and the second protective layer 152 may be 5 μm to 20 μm. When the thickness of the first protective layer 151 and the second protective layer 151 is greater than 20 μm, the thickness of the circuit board may increase. When the thickness of the first protective layer 151 and the second protective layer 152 is less than 1 μm, the reliability of the circuit pattern may be deteriorated.

Meanwhile, a cavity 160 may be formed in the second insulating layer 120. In this case, the cavity 160 may be disposed in the second insulating layer 120 composed of a plurality of layers. In this case, the cavity 160 may be provided to pass through at least one insulating layer among the second insulating layers 120 composed of the plurality of layers, and may be provided to non-pass through at least another insulating layer.

That is, a general cavity is provided through the insulating layer. Accordingly, the insulating layer overlapping the cavity 160 in the horizontal direction does not exist at the position where the cavity 160 is to be disposed. For example, the cavity in the comparative example is disposed to pass through the entire second insulating layer 120. For example, the cavity in the comparative example is formed penetrating from the top surface to the lower surface of the second insulating layer 120.

Unlike this, the cavity of the embodiment passes through at least one insulating layer among the insulating layers vertically overlapping the cavity 160 and does not pass through at least another insulating layer at the position where the cavity is to be disposed.

That is, in the first embodiment, the cavity 160 is disposed in the second insulating layer 120. That is, the cavity 160 is provided in the second-first insulating layer 121, the second-second insulating layer 122, and the second-third insulating layer 123. In addition, the cavity 160 in the second embodiment is provided in the second insulating layer 120 composed of one layer.

Hereinafter, the structure of the cavity formed in the second insulating layer 120 composed of a plurality of layers as in the first embodiment will be described first.

In this case, in the structure of the circuit board of the comparative example, the cavity is disposed to pass through all of the second-first insulating layer 121, the second-second insulating layer 122, and the second-third insulating layer 123. Accordingly, in the circuit board of the comparative example, the top surface of the first insulating layer in the region vertically overlapping with the cavity is exposed. That is, the second insulating layer (more specifically, the second-first insulating layer) does not exist on the top surface of the first insulating layer vertically overlapping with the cavity in the circuit board of the comparative example.

In contrast, the cavity 160 in the circuit board 100 in the embodiment shown in FIGS. 1A and 2A may be provided without passing through the second-first insulating layer 121 while passing through the second-second insulating layer 122 and the second-third insulating layer 123.

That is, the cavity 160 may include a first part P1 disposed in the second-first insulating layer 121, a second part P2 disposed in the second-second insulating layer 122, and a third part P3 disposed in the second-third insulating layer 123. Here, as the second insulating layer 122 in the embodiment has a three-layer structure, the cavity 160 is illustrated as being composed of the first to third parts P1, P2, and P3, but the embodiment is not limited thereto. For example, when the second insulating layer 120 has a two-layer structure, the cavity 160 may include only the first and second parts. For example, when the second insulating layer 122 has a five-layer structure, the cavity 160 may include first to fifth parts. However, the cavity 160 in the embodiment is characterized in that the lowermost part has a groove shape rather than a through hole shape.

The first part P1 may be provided in the second-first insulating layer 121. In this case, the first part P1 may be a groove provided in the second-first insulating layer 121 and forming a lower region of the cavity 160.

The second part P2 may be provided in the second-second insulating layer 122. The second part P2 is provided in the second-second insulating layer 122 and may be a through hole forming a central region of the cavity 160.

The third part P3 may be provided in the second-third insulating layer 123. The third part P3 is provided in the second-third insulating layer 123 and may be a through hole forming an upper region of the cavity 160.

That is, the cavity 160 may be formed of a combination of the first part P1, the second part P2, and the third part P3. In this case, a thickness of the first part P1 may be smaller than the thickness of the second-first insulating layer 121.

Accordingly, the cavity 160 may be formed without passing the second-first insulating layer 121.

In other words, the second-first insulating layer 121 may include a first portion disposed on a region vertically overlapping with the cavity 160 and a second portion excluding the first portion. In addition, a thickness H2 of the first portion may be different from a thickness H1 of the second portion.

Preferably, the thickness H1 of the second portion may be the thickness of the second-first insulating layer 121.

The second portion may have a thickness of 5 µm to 20 µm. For example, the thickness of the second portion corresponds to the thickness of the second-first insulating layer 121 composed of one layer of RCC, and thus may have a thickness of 5 µm to 20 µm.

A thickness H2 of the first portion may be smaller than a thickness H1 of the second portion. The thickness H2 of the first portion may be determined by a thickness H3 of the pad 141a. Preferably, the thickness H2 of the first portion may be smaller than the thickness H3 of the pad 141a.

Preferably, the thickness H3 of the pad 141a may be smaller than the thickness H1 of the second portion. For example, the thickness H3 of the pad 141a may be 5 µm to 10 µm.

In addition, a thickness H2 of the first portion may be smaller than a thickness H3 of the pad 141a. For example, the thickness H2 of the first portion may be 3 µm to 8 µm. Accordingly, the first portion of the second-first insulating layer 121 is disposed on the first insulating layer 110. In this case, the first portion of the second-first insulating layer 121 may expose the top surface of the pad 141a disposed on the first insulating layer 110.

That is, in the embodiment, in order to mount the electronic device, the cavity 160 is not formed through the second insulating layer 120, the cavity 160 is formed in a state in which at least a portion of the second insulating layer 120 (the first portion of the second-first insulating layer 121) remains on the first insulating layer 110.

In this case, the thickness H2 of a portion of the remaining second insulating layer 120 is smaller than the thickness H3 of the pad 141a to be exposed on the cavity 160. Accordingly, in an embodiment, the cavity 160 may be formed while maintaining the shape of the pad 141a without affecting the mounting of the electronic device on the pad 141a.

That is, in the prior art, in order to form the cavity in the plurality of insulating layers as described above, the cavity forming process was performed in a state in which a protective layer or a stop layer was disposed on the first insulating layer. Accordingly, in the prior art, the cavity could be formed to a desired depth (a depth passing all of the second insulating layer). However, in the related art, after the cavity is formed, an etching process of removing the protective layer or the stop layer has to be performed. Accordingly, in the prior art, a portion of the pad disposed on the first insulating layer is also removed during the etching process of removing the protective layer or the stop layer, which may cause a problem in reliability of the pad. In this case, the thickness of the protective layer or stop layer required for sand blasting or laser processing is 3 um to 10 um, and accordingly, there is a problem in that an amount corresponding to the thickness of the protective layer or the stop layer among the total thickness of the pad is removed during the etching process.

Accordingly, in the embodiment, the cavity can be easily formed without forming the protective layer or the stop layer, thereby solving the reliability problem that occurs during the process of removing the protective layer or the stop layer.

And, this allows the cavity 160 to be formed without passing the second-first insulating layer 121 by controlling the process conditions for forming the cavity.

In this case, the cavity 160 may be formed by a laser process. Here, in the absence of the protective layer or the stop layer, it is not easy to form a cavity to a desired depth through the laser process. In this case, in the embodiment, the process conditions of the laser are controlled based on the range between the minimum depth and the maximum depth that the cavity 160 should have, and through this, the cavity 160 can be formed to a desired depth. Here, the controlled process conditions may include a laser process speed and laser intensity. That is, by changing the process speed and intensity conditions while the laser process progress time is fixed, the depth of the cavity 160 can be controlled in um units. Accordingly, in the embodiment, the cavity 160 can be formed within a range between a minimum depth and a maximum depth that the cavity should have by adjusting the laser process speed and intensity. The maximum depth of the cavity 160 may be smaller than the total thickness of the second insulating layer 120. Also, the minimum depth of the cavity 160 may be greater than a depth obtained by subtracting the thickness of the pad 141a from the total thickness of the second insulating layer 120. Accordingly, the top surface of the first portion of the second-first insulating layer 121 of the second insulating layer 120 in the embodiment is positioned higher than the top surface of the first insulating layer 110, and is positioned lower than the top surface of the pad 141a.

Meanwhile, referring to FIGS. 1A and 2A, the cavity 160 includes an inner wall S1 and S2 and a bottom surface S3.

The inner wall S1 and S2 and the bottom surface S3 of the cavity 160 may have a predetermined surface roughness. In this case, in the embodiment, an additional process is not performed so that the inner wall S1 and S2 and the bottom surface S3 of the cavity 160 have a predetermined surface roughness, and the surface roughness may be formed during the laser process for forming the cavity 160.

In other words, the bottom surface S3 of the cavity 160 may mean the top surface of the first portion of the second insulating layer 120. In addition, the height of the top surface of the first portion of the second insulating layer 121 is not constant and may have a deviation depending on the position.

Meanwhile, in the embodiment, the cavity 160 is formed using a Gaussian beam. In this case, the outermost portion of the cavity 160 is processed using a center point of the Gaussian beam. That is, the center point of the Gaussian beam generates the laser with a highest intensity, and accordingly, an inclination angle of the inner wall of the cavity 160 at the outermost portion may be smaller than an inclination angle of the inner wall of the cavity of the comparative example.

In other words, the inner wall of the cavity 160 may include a first inner wall S2 extending from the bottom surface S3 and a second inner wall S1 extending from the first inner wall S2.

In addition, the first inner wall S2 may have a first inclination angle θ2. The first inclination angle θ2 may refer to an inclination angle of an imaginary straight line connecting one end E1 and the other end E3 of the first inner wall S2 with respect to a reference plane BS.

In addition, the second inner wall S1 may have a second inclination angle θ1. In this case, the second inclination angle θ1 of the second inner wall S1 may be smaller than the first inclination angle θ2. The second inclination angle θ1 may mean an inclination angle of an imaginary straight line connecting one end E2 and the other end E1 of the second inner wall S1 with respect to the reference plane BS.

That is, the second inner wall S1 is a portion processed using the center point of the Gaussian beam, and thus may have a second inclination angle θ1 smaller than the first inclination angle θ2. In this case, when the bottom surface S3 of the cavity 160 is flat, the reference plane BS may be the bottom surface S3 of the cavity 160. In addition, the reference plane BS may be a top surface of the first insulating layer overlapping in a vertical direction with a region where the cavity 160 is formed.

The first inclination angle θ2 may have a range of 130 degrees to 160 degrees. In addition, the second inclination angle θ1 may have a range of 91 degrees to 130 degrees smaller than the first inclination angle θ2.

As described above, in the embodiment, when forming the outermost portion of the cavity 160, it can be formed using the center point of the Gaussian beam to have a smaller inclination angle than the comparative example, and accordingly, a total area occupied by the cavity 160 may be reduced.

In other words, the inner wall of the cavity 160 in the embodiment may include a first inner wall S2 having a first inclination angle θ2 and a second inner wall S1 having a second inclination angle θ1 based on the inflection point E1, and the first inclination angle θ2 and the second inclination angle θ1 may be different from each other. Preferably, the first inclination angle θ2 of the first inner wall S2 adjacent to the bottom surface S3 may be greater than the second inclination angle θ1 of the second inner wall S1 spaced apart from the bottom surface S3.

In this case, the inflection point may be a point where the first inner wall S2 and the second inner wall S1 meet each other. That is, the first inner wall S2 may be positioned on the lower side of the inflection point, and the second inner wall S1 may be positioned on the upper side.

Meanwhile, the height of the inflection point may be positioned between the height of the first portion of the second-first insulating layer 121 and the height of the second portion of the second-first insulating layer 121. Preferably, the height of the inflection point may be higher than the top surface of the pad 141a and lower than the top surface of the second-first insulating layer 121.

As described above, when forming the cavity 160 in the embodiment, the second inner wall S1 of the outermost portion of the cavity 160 has a second inclination angle θ1, and the first inner wall S2 between the second inner wall S1 and the bottom surface S3 has a first inclination angle θ2. This can be implemented by processing the outermost portion of the cavity 160 using the center point of the Gaussian beam, and accordingly, the inclination angle of the outermost portion of the cavity 160 can be reduced compared to the comparative example, and thus the space required for forming the cavity can be drastically reduced.

Accordingly, the cavity 160 in the embodiment may include a first region R1 including the second inner wall S1, a second region R2 including the first inner wall S2 and a third region R3 corresponding to the bottom surface S3.

In addition, the height of the bottom surface S3 may be lower than that of the pad 141a and disposed on the top surface of the first insulating layer.

In addition, the first inner wall S2 corresponding to the second region R2 may extend upward from the bottom surface S3 while having a first inclination angle θ2.

In addition, the second inner wall S1 corresponding to the first region R1 may extend upward from the first inner wall S2 while having a second inclination angle θ1.

Meanwhile, the cavity in the second embodiment may be formed in the second insulating layer 120 composed of a single layer.

That is, the cavity 160 in the circuit board 100 according to the second embodiment may be formed without penetrating the second insulating layer 120.

In other words, the second insulating layer 120 may include a first portion disposed on a region vertically overlapping the cavity 160 and a second portion excluding the first portion. In addition, the thickness H2 of the first portion may be different from the thickness H1 of the second portion.

Preferably, the thickness H1 of the second region may correspond to the entire thickness of the second insulating layer 120.

The second portion may have a thickness of 5 μm to 20 μm. That is, the second insulating layer 120 is composed of one layer of RCC, and thus may have a thickness of 5 μm to 20 μm.

A thickness H2 of the first portion may be smaller than a thickness H1 of the second portion. The thickness H2 of the first portion may be determined by the thickness H3 of the pad 141a. Preferably, the thickness H2 of the first portion may be smaller than the thickness H3 of the pad 141a.

Preferably, the thickness H3 of the pad 141a may be smaller than the thickness H1 of the second portion. For example, the thickness H3 of the pad 141a may be 5 μm to 10 μm.

In addition, the thickness H2 of the first portion may be smaller than the thickness H3 of the pad 141a. For example, the thickness H2 of the first portion may be 3 μm to 8 μm. Thus, the first portion of the second insulating layer 120 is disposed on the first insulating layer 110. In this case, the first portion of the second insulating layer 120 may expose the top surface of the pad 141a disposed on the first insulating layer 110.

That is, in the embodiment, the cavity 160 is formed so that the cavity 160 does not penetrate the second insulating layer 120 and at least a portion of the second insulating layer 120 remains on the first insulating layer 110.

In this case, the thickness H2 of the remaining portion of the second insulating layer 120 is smaller than the thickness H3 of the pad 141a to be exposed on the cavity 160. Accordingly, in the embodiment, the cavity 160 may be formed while maintaining the shape of the pad 141a without affecting the mounting of the electronic device on the pad 141a.

Meanwhile, referring to FIGS. 1B and 2B, the cavity 160 includes inner walls S1 and S2 and a bottom surface S3.

The inner wall S1 and S2 and the bottom surface S3 of the cavity 160 may have a predetermined surface roughness. In this case, in the embodiment, an additional process is not performed so that the inner wall S1 and S2 and the bottom surface S3 of the cavity 160 have a predetermined surface roughness, and the surface roughness may be formed during the laser process for forming the cavity 160.

In other words, the bottom surface S3 of the cavity 160 may mean the top surface of the first portion of the second-first insulating layer 121. In addition, the height of the top surface of the first portion of the second-first insulating layer 121 is not constant and may have a deviation depending on the position. Such a height deviation of the bottom surface S3 may be caused by a difference in energy between the center line and the outer portion of the laser beam.

In addition, the inner wall of the cavity 160 may include a first inner wall S2 extending from the bottom surface S3 and a second inner wall S1 extending from the first inner wall S2.

In addition, the first inner wall S2 may have a first inclination angle θ2. The first inclination angle θ2 may refer to an inclination angle of an imaginary straight line connecting one end E1 and the other end E3 of the first inner wall S2 with respect to a reference plane BS.

In addition, the second inner wall S1 may have a second inclination angle θ1. In this case, the second inclination angle θ1 of the second inner wall S1 may be smaller than the first inclination angle θ2. The second inclination angle θ1 may mean an inclination angle of an imaginary straight line connecting one end E2 and the other end E1 of the second inner wall S1 with respect to the reference plane BS.

That is, the second inner wall S1 is a portion processed using the center point of the Gaussian beam, and thus may have a second inclination angle θ1 smaller than the first inclination angle θ2. In this case, when the bottom surface S3 of the cavity 160 is flat, the reference plane BS may be the bottom surface S3 of the cavity 160. In addition, the reference plane BS may be a top surface of the first insulating layer overlapping in a vertical direction with a region where the cavity 160 is formed.

The first inclination angle θ2 may have a range of 130 degrees to 160 degrees. In addition, the second inclination angle θ1 may have a range of 91 degrees to 130 degrees smaller than the first inclination angle θ2.

As described above, in the embodiment, when forming the outermost portion of the cavity 160, it can be formed using the center point of the Gaussian beam to have a smaller inclination angle than the comparative example, and accordingly, a total area occupied by the cavity 160 may be reduced.

In other words, the inner wall of the cavity 160 in the embodiment may include a first inner wall S2 having a first inclination angle θ2 and a second inner wall S1 having a second inclination angle θ1 based on the inflection point E1, and the first inclination angle θ2 and the second inclination angle θ1 may be different from each other. Preferably, the first inclination angle θ2 of the first inner wall S2 adjacent to the bottom surface S3 may be greater than the second inclination angle θ1 of the second inner wall S1 spaced apart from the bottom surface S3.

In this case, the inflection point may be a point where the first inner wall S2 and the second inner wall S1 meet each other. That is, the first inner wall S2 may be positioned on the lower side of the inflection point, and the second inner wall S1 may be positioned on the upper side.

Meanwhile, the height of the inflection point may be positioned between the height of the first portion of the second-first insulating layer 121 and the height of the second portion of the second-first insulating layer 121. Preferably, the height of the inflection point may be higher than the top surface of the pad 141a and lower than the top surface of the second-first insulating layer 121.

As described above, when forming the cavity 160 in the embodiment, the second inner wall S1 of the outermost portion of the cavity 160 has a second inclination angle θ1, and the first inner wall S2 between the second inner wall S1 and the bottom surface S3 has a first inclination angle θ2. This can be implemented by processing the outermost portion of the cavity 160 using the center point of the Gaussian beam, and accordingly, the inclination angle of the outermost portion of the cavity 160 can be reduced compared to the comparative example, and thus the space required for forming the cavity can be drastically reduced.

Accordingly, the cavity 160 in the embodiment may include a first region R1 including the second inner wall S1, a second region R2 including the first inner wall S2 and a third region R3 corresponding to the bottom surface S3.

In addition, the height of the bottom surface S3 may be lower than that of the pad 141a and disposed on the top surface of the first insulating layer.

In addition, the first inner wall S2 corresponding to the second region R2 may extend upward from the bottom surface S3 while having a first inclination angle θ2.

In addition, the second inner wall S1 corresponding to the first region R1 may extend upward from the first inner wall S2 while having a second inclination angle θ1.

Meanwhile, a ratio of the first inner wall S2 and the second inner wall S3 in the embodiment may vary depending on the moving pitch of the laser beam during cavity processing, and the length ratio of the first inner wall S2 and the second inner wall S3 can be adjusted to 1:9 to 9:1 by adjusting the moving pitch of the laser beam, Hereinafter, a package substrate including the structure of the circuit board in the first embodiment and a manufacturing method thereof will be described.

FIG. 3 is a view showing a package substrate according to a first embodiment.

Referring to FIG. 3, a package substrate 200 in the embodiment includes the circuit board 100 shown in FIG. 1 and the electronic device 180 mounted in the cavity 160 of the circuit board 100.

The circuit board 100 described with reference to FIGS. 1A, 1B, 2A and 2B may be used as a package substrate 200 for mounting the electronic device 180.

In this case, since the circuit board 100 has already been described in detail above, a description thereof will be omitted.

The circuit board 100 includes a cavity 160, and a pad 141a may be exposed in the cavity 160. In this case, the second-first insulating layer 121 may be disposed in a region other than the area where the pad 141a is formed within the cavity 160. However, the height of the first portion of the second-first insulating layer 121 is lower than the height of the pad 141a. Accordingly, the electronic device 180 may be stably mounted on the pad 141a without being affected by the first portion of the second insulating layer. In other words, when the height of the first portion of the second-first insulating layer 121 is higher than the height of the pad 141a, the electronic device 180 may be mounted on the pad 141a in an inclined state, and furthermore, a defect may occur in an electrical connection state with the pad 141a.

In this case, the electronic device 180 may be electronic components such as chips, which may be divided into active devices and passive devices. In addition, the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general circuit board to increase a signal processing speed of a semiconductor chip, which is an active device, or to perform a filtering function.

Meanwhile, a connection portion 170 may be disposed on the pad 141a. A planar shape of the connection portion 170 may be a quadrangle. The connection portion 170 is disposed on the pad 141a and electrically connects the electronic device 180 and the pad 141*a* while fixing the electronic device 180. To this end, the pad 141*a* may be formed of a conductive material. For example, the connection portion 170 may be a solder ball. In the connection portion 170, a heterogeneous material may be contained in the solder. The solder may be composed of at least one of SnCu, SnPb, and SnAgCu. In addition, the heterogeneous material may include any one of Al, Sb, Bi, Cu, Ni, In, Pb, Ag, Sn, Zn, Ga, Cd, and Fe.

Meanwhile, the top surface of the electronic device 180 may be positioned higher than the surface of the uppermost layer of the circuit board 100. However, the embodiment is not limited thereto, and depending on the type of the electronic device 180, the top surface of the electronic device 180 may be disposed at the same height as the surface of the uppermost layer of the circuit board 100 or may be positioned lower otherwise.

Figure 4:
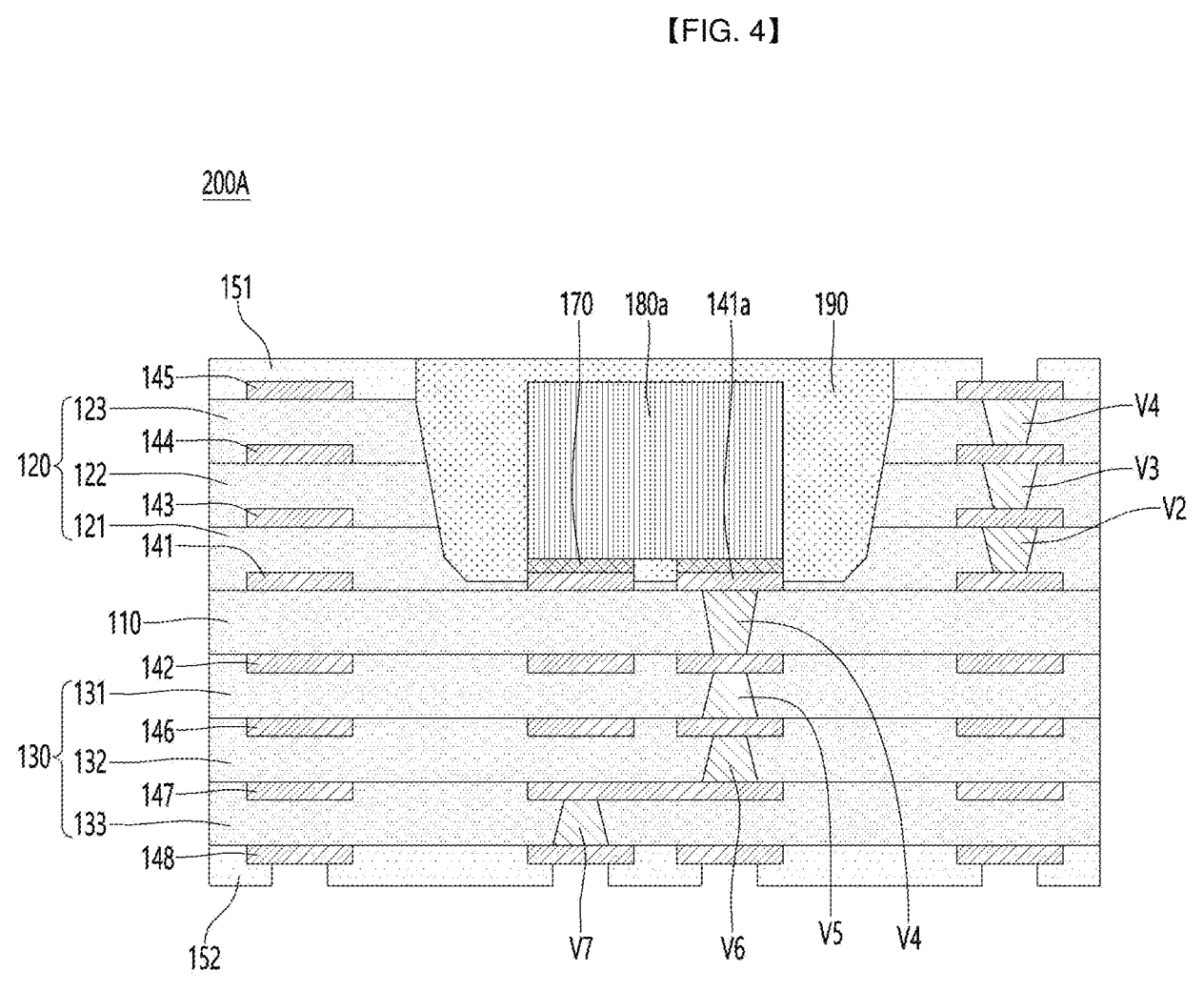

FIG. 4 is a view showing a package substrate according to a second embodiment.

Referring to FIG. 4, the package substrate 200A in the embodiment includes the circuit board 100 and an electronic device 180*a* mounted in the cavity 160 of the circuit board 100.

In addition, the package substrate 200A further includes a molding layer disposed in the cavity 160 to cover the electronic device 180*a*.

The molding layer 190 may be selectively disposed in the cavity 160 to protect the electronic device 180*a* mounted in the cavity 160.

The molding layer 190 may be formed of a molding resin, for example, EMC (Epoxy Molding Compound). However, the embodiment is not limited thereto, and the molding layer 190 may be formed of various other molding resins in addition to EMC.

The circuit board 100 may be used as a package substrate 200A for mounting the electronic device 180*a*.

The circuit board 100 includes a cavity 160, and a pad 141*a* may be exposed in the cavity 160. In this case, the second-first insulating layer 121 may be disposed in a region other than the area where the pad 141*a* is formed within the cavity 160. However, the height of the first portion of the second-first insulating layer 121 is lower than the height of the pad 141*a*. Accordingly, the electronic device 180*a* may be stably mounted on the pad 141*a* without being affected by the first portion of the second-first insulating layer 121. In other words, when the height of the first portion of the second-first insulating layer 121 is higher than the height of the pad 141*a*, the electronic device 180*a* may be mounted on the pad 141*a* in an inclined state, and furthermore, a defect may occur in an electrical connection state with the pad 141*a*.

In the embodiment, the molding layer 190 is disposed in contact with the inner wall S1 and S2 and the bottom surface S3 of the cavity 160. In this case, the inner wall S1 and S2 of the cavity 160 may include a first inner wall S2 and a second inner wall S1 having different inclination angles based on an inflection point, rather than a single inclination angle. The structure of the cavity 160 as described above may increase a surface area in contact with the molding layer 190, and thus improve bonding strength between the molding layer 190 and the circuit board 100.

According to an embodiment, the circuit board includes a cavity. In addition, the cavity 160 of the circuit board has a non-penetrating structure rather than a structure penetrating the second insulating layer 120. In this case, the cavity 160 exposes the pad 141*a* disposed on a top surface of the first insulating layer 110. In this case, a bottom surface of the cavity 160 is positioned lower than the top surface of the pad. Accordingly, in the embodiment, it is not necessary to form an additional stop layer on the top surface of the first insulating layer to form the cavity 160, and accordingly, it may omit processes such as the formation and removal of the stop layer. In addition, the embodiment may solve the reliability problem due to the change in thickness or shape of the pad 141*a* that may occur in the process of removing the stop layer in the comparative example, and thereby improve product reliability.

In addition, the cavity of the circuit board of the embodiment includes a bottom surface and an inner wall. In this case, the inner wall of the cavity includes a first part extending from the bottom surface and having a first inclination angle; and a second part extending to the first part and having a second inclination angle. In this case, the first inclination angle and the second inclination angle are different from each other. In other words, the inner wall of the cavity of the embodiment may include an inflection point at which an inclination angle changes between the first part and the second part. In this case, each of the first inclination angle and the second inclination angle may mean an internal angle with the bottom surface. In addition, the first inclination angle may be smaller than the second inclination angle. Preferably, the second part of the inner wall constituting an outermost portion of the cavity of the embodiment may have a second inclination angle, and the first part of the inner wall may have a first inclination angle greater than the second inclination angle. The above embodiment can reduce the inclination angle of the second part of the inner wall compared to the comparative example, and accordingly when the same device is disposed, the embodiment may minimize a space required for forming a cavity compared to the comparative example, thereby improving circuit integration. In other words, the embodiment may reduce the inclination angle of the second portion of the inner wall, and accordingly, more circuits can be formed within the same area compared to the comparative example, and thus the overall volume of the circuit board can be reduced.

Hereinafter, a method of manufacturing a circuit board according to an embodiment will be described with reference to the accompanying drawings.

FIGS. 5 to 13 are views showing a method of manufacturing the circuit board shown in FIG. 1A in order of process Referring to FIG. 5, the first insulating layer 110 may be prepared, and first and second circuit patterns 141 and 142 may be formed on the surface of the first insulating layer 110, and the first via V1 passing through the first insulating layer 110 and electrically connecting the first and second circuit patterns 141 and 142 may be formed.

The first insulating layer 110 may be a prepreg. The prepreg (PPG) has good flowability and adhesion in a semi-cured state, it is used as an intermediate substrate for fiber-reinforced composite materials used as an adhesive layer and an insulating material layer, and it is a molding material in which reinforcing fibers are pre-impregnated with a matrix resin. A molded article is formed by laminating these prepregs and curing the resin by heating/pressing. That is, the prepreg refers to a material that is impregnated with resin (BT/Epoxy, FR4, FR5, etc.) into glass fiber and cured to B-stage.

That is, the first insulating layer 110 may be a thermosetting or thermoplastic polymer substrate, a ceramic substrate, an organic-inorganic composite material substrate, or a glass fiber impregnated substrate. In the case of including a polymer resin, an epoxy-based insulating resin may be included, and alternatively, a polyimide-based resin may be included.

The first insulating layer 110 is a substrate on which an electric circuit capable of changing wiring is formed, and it may include a circuit board and an insulating substrate made of an insulating material capable of forming circuit patterns on the surface thereof.

A metal layer (not shown) is laminated on the surface of the first insulating layer 110. The metal layer may be formed by electroless plating a metal including copper on the first insulating layer 110. In addition, unlike the formation of the metal layer by electroless plating on the first insulating layer 110, copper clad laminate (CCL) may be used.

When the metal layer is formed by electroless plating, roughness is provided to the top surface of the first insulating layer 110 so that plating can be performed smoothly. Then, by patterning the metal layer, first and second circuit patterns 141 and 142 are respectively formed on the top and bottom surfaces of the first insulating layer 110. In this case, the first circuit pattern 141 may include a pad 141a connected to the electronic devices 180 and 180a to be mounted on the first insulating layer 110 later through the connection part 170.

As described above, the first and second circuit patterns 141 and 142 may be formed by an additive process, a subtractive process, a modified semi additive process (MSAP) and a semi additive process (SAP) method, which is a typical circuit board manufacturing process, and a detailed description thereof will be omitted herein.

Figure 6:
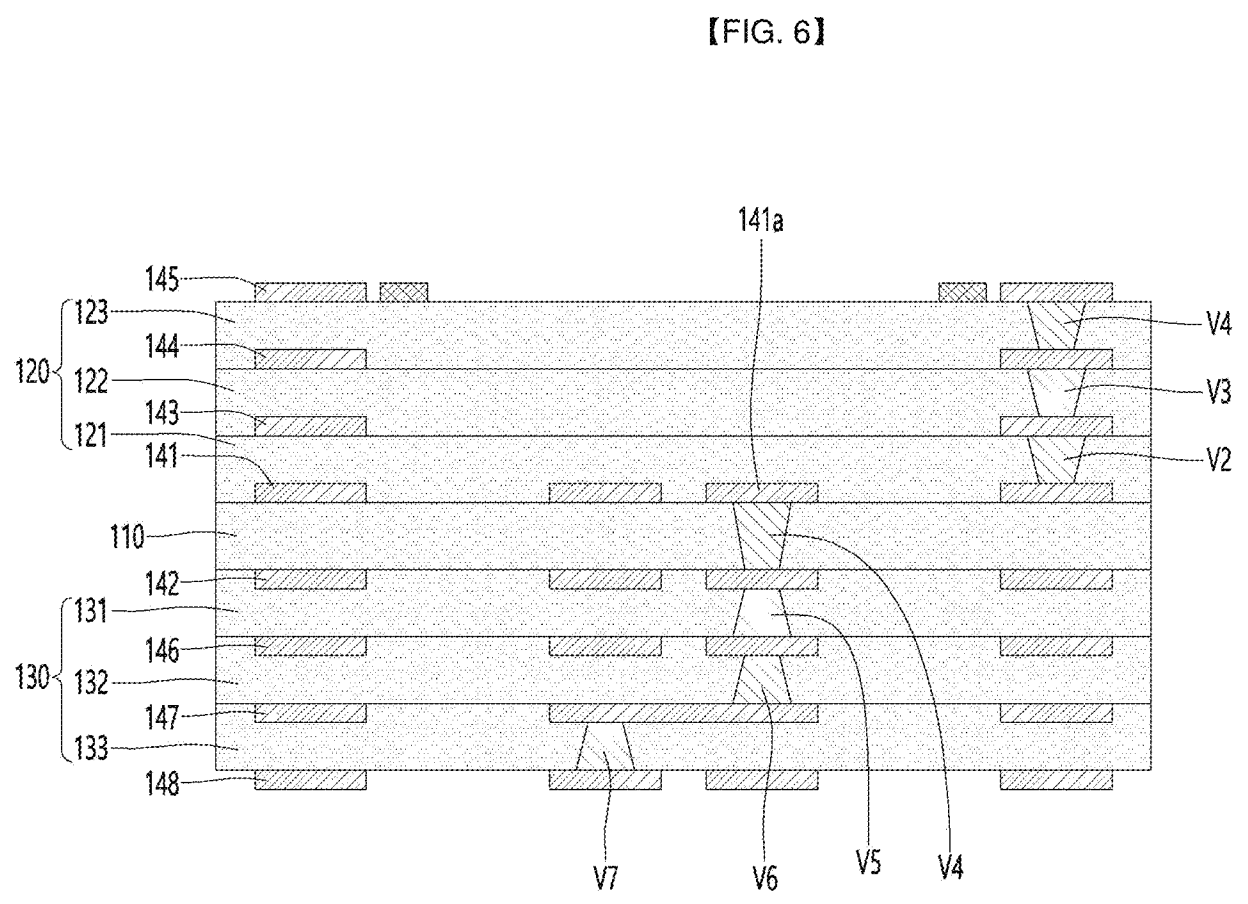

Next, referring to FIG. 6, a process of laminating the second insulating layer 120 and the third insulating layer 130 on upper and lower portions of the first insulating layer 110 may be performed, respectively.

In this case, the second insulating layer 120 has a structure of a plurality of layers. For example, the second insulating layer 120 may include the second-first insulating layer 121 disposed on the top surface of the first insulating layer 110, the second-second insulating layer 122 disposed on the top surface of the second-first insulating layer 121, and the second-third insulating layer 123 disposed on the top surface of the second-second insulating layer 122.

In addition, the third insulating layer 130 has a plurality of layer structures. For example, the third insulating layer 130 may include the third-first insulating layer 131 disposed under a bottom surface of the first insulating layer 110, the third-second insulating layer 132 disposed under a bottom surface of the third-first insulating layer 131, and the third-third insulating layer 133 disposed under a bottom surface of the third-second insulating layer 132.

However, the embodiment is not limited thereto, and as shown in FIG. 1B, the second insulating layer 120 and the third insulating layer 130 may be composed of a single layer.

In addition, the second insulating layer 120 and the third insulating layer 130 may be composed of RCC.

That is, all of the plurality of layers constituting the second insulating layer 120 and the third insulating layer 130 in the first embodiment may be composed of RCC.

In addition, each single layer constituting the second insulating layer 120 and the third insulating layer 130 in the second embodiment may be composed of RCC.

Accordingly, the second insulating layer 120 and the third insulating layer 130 may have a thickness of 5 µm to 20 µm. For example, when the second insulating layer 120 has a multi-layer structure, each of the plurality of layers may have a thickness of 5 µm to 20 µm. In addition, when the second insulating layer 120 has a single layer, the thickness of the single layer of the second insulating layer 120 may be 5 µm to 20 µm.

In addition, a process of forming a circuit pattern on the surface of the second insulating layer 120 may be performed. For example, a process of forming a plurality of third circuit patterns 143 spaced apart from each other by a predetermined distance on the top surface of the second-first insulating layer 121 may be performed. In addition, a process of forming a plurality of fourth circuit patterns 144 spaced apart from each other by a predetermined distance may be performed on the top surface of the second-second insulating layer 122. In addition, a process of forming a plurality of fifth circuit patterns 145 spaced apart from each other by a predetermined distance on the top surface of the second-third insulating layer 123 may be performed.

In addition, a process of forming a circuit pattern on the surface of the third insulating layer 130 may be performed. For example, a process of forming a plurality of sixth circuit patterns 146 spaced apart from each other by a predetermined distance on the bottom surface of the third-first insulating layer 131 may be performed. In addition, a process of forming a plurality of seventh circuit patterns 147 spaced apart from each other by a predetermined distance on the bottom surface of the third-second insulating layer 132 may be performed. In addition, a process of forming a plurality of eighth circuit patterns 148 spaced apart from each other by a predetermined distance on the bottom surface of the third-third insulating layer 133 may be performed.

In addition, a process of forming vias V1, V2, V3, V4, which electrically connect circuit patterns disposed on different layers in the first insulating layer 110, the second insulating layer 120, and the third insulating layer 130 to each other may be performed.

Meanwhile, a mask pattern 145a may be formed on a top surface of the second insulating layer 120 together with the fifth circuit pattern 145. The mask pattern 145a may be formed surrounding a region where a cavity is to be formed on the top surface of the second insulating layer 120. The mask pattern 145a may be formed of the same metal material as the fifth circuit pattern 145. For example, the mask pattern 145a may be formed of a metal material including copper.

Next, referring to FIG. 7, a process of forming the cavity 160 on the cavity region of the second insulating layer 120 may be performed. In this case, the cavity 160 may be formed in the second insulating layer 120 composed of a plurality of layers.

In this case, the cavity 160 may be formed by a laser process using a Gaussian beam.

Here, in the absence of the protective layer or the stop layer, it is not easy to form a cavity to a desired depth through the laser process. In this case, in the embodiment, the process conditions of the laser are controlled based on the range between the minimum depth and the maximum depth that the cavity 160 should have, and through this, the cavity 160 can be formed to a desired depth. Here, the controlled process conditions may include a laser process speed and intensity. That is, by changing the laser process speed and intensity conditions, the depth of the cavity 160 can be controlled in um units. Accordingly, in the embodiment, the cavity 160 can be formed within a range between a minimum depth and a maximum depth that the cavity should have by adjusting the laser process speed and intensity. The maximum depth of the cavity 160 may be smaller than the total thickness of the second insulating layer 120. In addition, the minimum depth of the cavity 160 may be greater than a depth obtained by subtracting the thickness of the pad 141*a* from the total thickness of the second insulating layer 120.

In this case, in the embodiment, an outermost region of the cavity 160 is formed using the center line CP of the Gaussian beam 200. In this case, referring to FIG. 7, a right beam based on the center line of the Gaussian beam 200 is positioned within the cavity region, but the right beam is positioned outside the cavity region, and when processing the outermost region of the cavity 160, processing of an area other than the cavity formation is prevented by forming the mask pattern 145*a* as described above.

Figure 8:
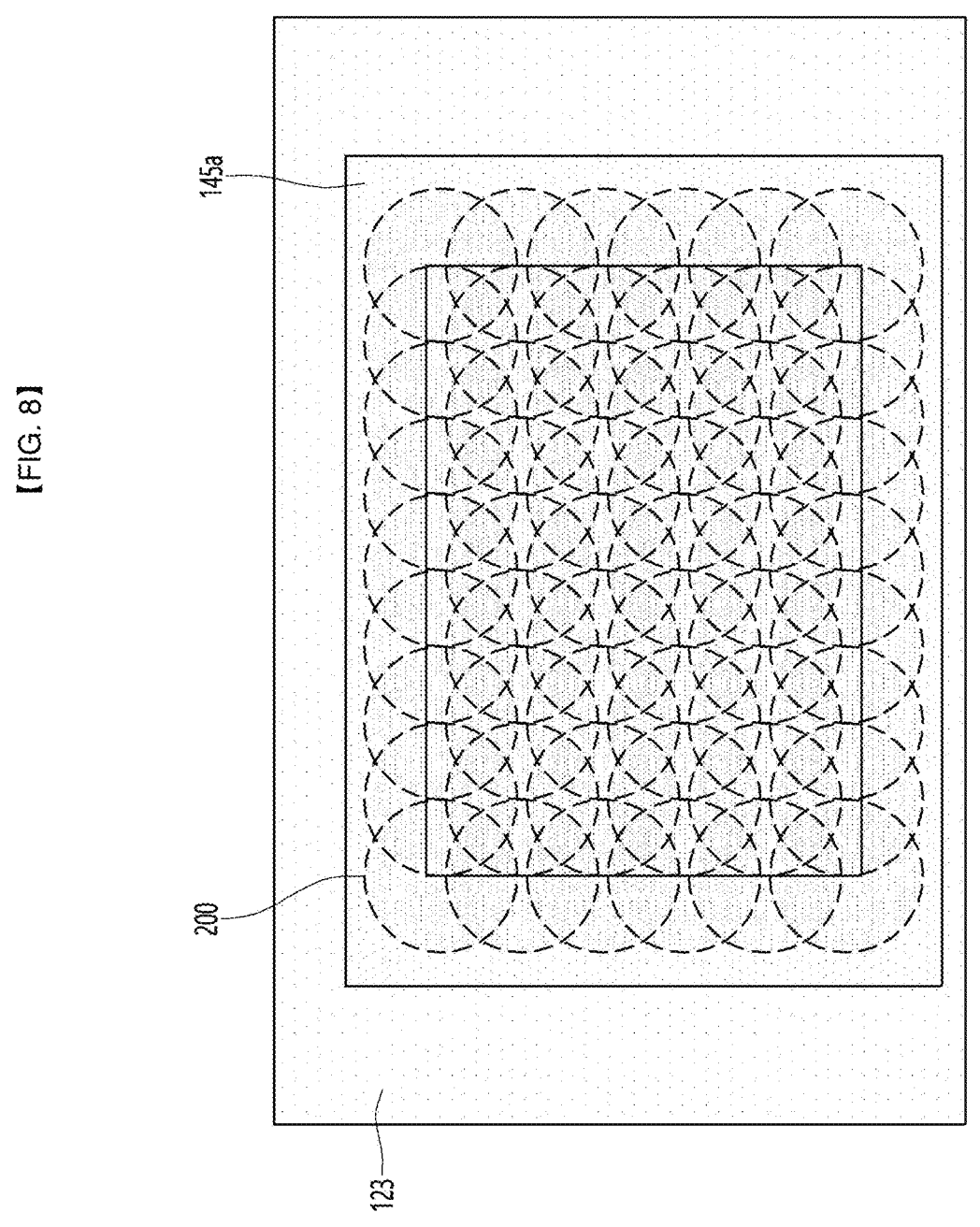

FIG. 8 is a view for explaining a cavity processing method according to an embodiment, and FIG. 9 is a view for explaining a cavity processing method according to a comparative example.

Referring to FIG. 8, in the embodiment, the outermost region of the cavity 160 is processed using a beam of a center line of a Gaussian beam based on a mask pattern 145*a*. In addition, in the embodiment, the entire region of the cavity 160 is processed while moving the Gaussian beam at a certain distance.

In this case, the embodiment proceeds with the processing of the outermost region of the cavity using the center line of a first Gaussian beam. And, when the cavity processing using the first Gaussian beam is completed, a second Gaussian beam is provided at a position separated by a predetermined distance from the first Gaussian beam. In this case, the first Gaussian beam and the second Gaussian beam are spaced apart by a predetermined distance, and accordingly, the cavity 160 of the embodiment may include a second inner wall S1 having a second inclination angle θ1 in the outermost region and a first inner wall S2 extending from the second inner wall S1 and having a first inclination angle θ2.

Meanwhile, referring to FIG. 9, in the comparative example, the cavity processing process is performed by positioning the outer portion of the laser beam at the outermost portion of the cavity.

Accordingly, as shown in FIG. 10, the inner wall of the outermost portion of the cavity in the comparative example has a third inclination angle θ3 of 160 degrees or more.

On the other hand, as shown in FIG. 11, the inner wall of the outermost portion of the cavity in the embodiment has a first inclination angle θ2 ranging from 99 degrees to 130 degrees.

For example, in the process of the comparative example, when a cavity is processed in a region having a size of 600 μm, a cavity of 500 μm smaller than 600 μm is formed due to an inclination angle of an inner wall of the cavity. This is because a lower region of the cavity is actually used as a cavity in which a device is mounted, but a space of about 100 μm cannot be used due to the inclination angle of the inner wall.

In contrast, in the embodiment, when a cavity is processed in a region having a size of 600 μm, a cavity of 550 μm, which is larger than that of the comparative example, is formed due to the improvement of the inclination angle of the inner wall of the cavity. Accordingly, in the embodiment, the space required for forming the cavity can be reduced, and thus the degree of circuit integration can be increased.

Referring to FIG. 12, a cavity 160 is formed in the second insulating layer 120 by controlling laser processing conditions using the same Gaussian beam.

In this case, the cavity 160 may be disposed passing through at least one insulating layer among the plurality of second insulating layers 120 and may be disposed not penetrating at least another insulating layer. That is, the cavity 160 may include a first part P1 disposed in the second-first insulating layer 121, a second part P2 disposed in the second-second insulating layer 122, and a third part P3 disposed in the second-third insulating layer 123. Here, as the second insulating layer 122 in the embodiment has a three-layer structure, the cavity 160 is illustrated as being composed of the first to third parts P1, P2, and P3, but the embodiment is not limited thereto. For example, when the second insulating layer 120 has a two-layer structure, the cavity 160 may include only the first and second parts. For example, when the second insulating layer 122 has a five-layer structure, the cavity 160 may include first to fifth parts. However, the cavity 160 in the embodiment is characterized in that the lowermost part has a groove shape rather than a through hole shape.

The first part P1 may be provided in the second-first insulating layer 121. In this case, the first part P1 may be a groove provided in the second-first insulating layer 121 and forming a lower region of the cavity 160.

The second part P2 may be provided in the second-second insulating layer 122. The second part P2 is provided in the second-second insulating layer 122 and may be a through hole forming a central region of the cavity 160.

The third part P3 may be provided in the second-third insulating layer 123. The third part P3 is provided in the second-third insulating layer 123 and may be a through hole forming an upper region of the cavity 160.

That is, the cavity 160 may be formed of a combination of the first part P1, the second part P2, and the third part P3. In this case, a thickness of the first part P1 may be smaller than the thickness of the second-first insulating layer 121. Accordingly, the cavity 160 may be formed without passing the second-first insulating layer 121.

In other words, the second-first insulating layer 121 may include a first portion disposed on a region vertically overlapping with the cavity 160 and a second portion excluding the first portion. In addition, a thickness H2 of the first portion may be different from a thickness H1 of the second portion.

Preferably, the thickness H1 of the second portion may be the thickness of the second-first insulating layer 121.

The second portion may have a thickness of 5 μm to 20 μm. For example, the thickness of the second portion corresponds to the thickness of the second-first insulating layer 121 composed of one layer of RCC, and thus may have a thickness of 5 μm to 20 μm.

A thickness H2 of the first portion may be smaller than a thickness H1 of the second portion. The thickness H2 of the first portion may be determined by a thickness H3 of the pad 141*a*. Preferably, the thickness H2 of the first portion may be smaller than the thickness H3 of the pad 141*a*.

Preferably, the thickness H3 of the pad 141*a* may be smaller than the thickness H1 of the second portion. For example, the thickness H3 of the pad 141*a* may be 5 μm to 10 μm.

In addition, a thickness H2 of the first portion may be smaller than a thickness H3 of the pad 141*a*. For example, the thickness H2 of the first portion may be 3 μm to 8 μm. Accordingly, the first portion of the second-first insulating layer 121 is disposed on the first insulating layer 110. In this case, the first portion of the second-first insulating layer 121 may expose the top surface of the pad 141*a* disposed on the first insulating layer 110. That is, in the embodiment, in order to mount the electronic device, the cavity 160 is not formed through the second insulating layer 120, the cavity 160 is formed in a state in which at least a portion of the second insulating layer 120 (the first portion of the second-first insulating layer 121) remains on the first insulating layer 110.

In this case, the thickness H2 of a portion of the remaining second insulating layer 120 is smaller than the thickness H3 of the pad 141a to be exposed on the cavity 160. Accordingly, in an embodiment, the cavity 160 may be formed while maintaining the shape of the pad 141a without affecting the mounting of the electronic device on the pad 141a.

That is, in the prior art, in order to form the cavity in the plurality of insulating layers as described above, the cavity forming process was performed in a state in which a protective layer or a stop layer was disposed on the first insulating layer. Accordingly, in the prior art, the cavity could be formed to a desired depth (a depth passing all of the second insulating layer). However, in the related art, after the cavity is formed, an etching process of removing the protective layer or the stop layer has to be performed. Accordingly, in the prior art, a portion of the pad disposed on the first insulating layer is also removed during the etching process of removing the protective layer or the stop layer, which may cause a problem in reliability of the pad. In this case, the thickness of the protective layer or stop layer required for sand blasting or laser processing is 3 um to 10 um, and accordingly, there is a problem in that an amount corresponding to the thickness of the protective layer or the stop layer among the total thickness of the pad is removed during the etching process.

Accordingly, in the embodiment, the cavity can be easily formed without forming the protective layer or the stop layer, thereby solving the reliability problem that occurs during the process of removing the protective layer or the stop layer.

And, this allows the cavity 160 to be formed without passing the second-first insulating layer 121 by controlling the process conditions for forming the cavity.

In this case, the inner wall S1 and S2 and the bottom surface S3 of the cavity 160 may have a predetermined surface roughness. In this case, in the embodiment, an additional process is not performed so that the inner wall S1 and S2 and the bottom surface S3 of the cavity 160 have a predetermined surface roughness, and the surface roughness may be formed during the laser process for forming the cavity 160. In other words, the bottom surface S3 of the cavity 160 may mean the top surface of the first portion of the second-first insulating layer 121. In addition, the height of the top surface of the first portion of the second-first insulating layer 121 is not constant and may have a deviation depending on the position.

That is, in the embodiment, the cavity 160 is formed using a Gaussian beam. In this case, the outermost portion of the cavity 160 is processed using a center point of the Gaussian beam. That is, the center point of the Gaussian beam generates the laser with a highest intensity, and accordingly, an inclination angle of the inner wall of the cavity 160 at the outermost portion may be smaller than an inclination angle of the inner wall of the cavity of the comparative example.

In other words, the inner wall of the cavity 160 may include a first inner wall S2 extending from the bottom surface S3 and a second inner wall S1 extending from the first inner wall S2.

In addition, the first inner wall S2 may have a first inclination angle $\theta 2$. The first inclination angle $\theta 2$ may refer to an inclination angle of an imaginary straight line connecting one end E1 and the other end E3 of the first inner wall S2 with respect to a reference plane BS.

In addition, the second inner wall S1 may have a second inclination angle $\theta 1$. In this case, the second inclination angle $\theta 1$ of the second inner wall S1 may be smaller than the first inclination angle $\theta 2$. The second inclination angle $\theta 1$ may mean an inclination angle of an imaginary straight line connecting one end E2 and the other end E1 of the second inner wall S1 with respect to the reference plane BS.

That is, the second inner wall S1 is a portion processed using the center point of the Gaussian beam, and thus may have a second inclination angle $\theta 1$ smaller than the first inclination angle $\theta 2$. In this case, when the bottom surface S3 of the cavity 160 is flat, the reference plane BS may be the bottom surface S3 of the cavity 160. In addition, the reference plane BS may be a top surface of the first insulating layer overlapping in a vertical direction with a region where the cavity 160 is formed.

The first inclination angle $\theta 2$ may have a range of 130 degrees to 160 degrees. In addition, the second inclination angle $\theta 1$ may have a range of 91 degrees to 130 degrees smaller than the first inclination angle $\theta 2$.

As described above, in the embodiment, when forming the outermost portion of the cavity 160, it can be formed using the center point of the Gaussian beam to have a smaller inclination angle than the comparative example, and accordingly, a total area occupied by the cavity 160 may be reduced.

In other words, the inner wall of the cavity 160 in the embodiment may include a first inner wall S2 having a first inclination angle $\theta 2$ and a second inner wall S1 having a second inclination angle $\theta 1$ based on the inflection point E1, and the first inclination angle $\theta 2$ and the second inclination angle $\theta 1$ may be different from each other. Preferably, the first inclination angle $\theta 2$ of the first inner wall S2 adjacent to the bottom surface S3 may be greater than the second inclination angle $\theta 1$ of the second inner wall S1 spaced apart from the bottom surface S3.

In this case, the inflection point may be a point where the first inner wall S2 and the second inner wall S1 meet each other. That is, the first inner wall S2 may be positioned on the lower side of the inflection point, and the second inner wall S1 may be positioned on the upper side.

Meanwhile, the height of the inflection point may be positioned between the height of the first portion of the second-first insulating layer 121 and the height of the second portion of the second-first insulating layer 121. Preferably, the height of the inflection point may be higher than the top surface of the pad 141a and lower than the top surface of the second-first insulating layer 121.

As described above, when forming the cavity 160 in the embodiment, the second inner wall S1 of the outermost portion of the cavity 160 has a second inclination angle $\theta 1$, and the first inner wall S2 between the second inner wall S1 and the bottom surface S3 has a first inclination angle $\theta 2$. This can be implemented by processing the outermost portion of the cavity 160 using the center point of the Gaussian beam, and accordingly, the inclination angle of the outermost portion of the cavity 160 can be reduced compared to the comparative example, and thus the space required for forming the cavity can be drastically reduced.

Accordingly, the cavity 160 in the embodiment may include a first region R1 including the second inner wall S1, a second region R2 including the first inner wall S2 and a third region R3 corresponding to the bottom surface S3.

In addition, the height of the bottom surface S3 may be lower than that of the pad 141a and disposed on the top surface of the first insulating layer.

In addition, the first inner wall S2 corresponding to the second region R2 may extend upward from the bottom surface S3 while having a first inclination angle θ2.

In addition, the second inner wall S1 corresponding to the first region R1 may extend upward from the first inner wall S2 while having a second inclination angle θ1.

Next, referring to FIG. 11, the mask pattern 145a formed on the top surface of the second insulating layer 120 is removed, and thus protective layers 151 and 152 are formed on the outermost portions of the second insulating layer 120 and the third insulating layer 130.

For example, the first protective layer 151 may be disposed on the top surface of the insulating layer disposed on the uppermost of the plurality of insulating layers. For example, the first protective layer 151 may be disposed on a top surface of the second-third insulating layer 123 disposed on the uppermost portion of the second insulating layer 120. In addition, a second protective layer 152 may be disposed on a bottom surface of the insulating layer disposed at the lowermost portion among the plurality of insulating layers. For example, a second protective layer 152 may be disposed on a bottom surface of the third-third insulating layer 133 disposed at the lowermost portion of the third insulating layer 130.

The first protective layer 151 and the second protective layer 152 may each have an opening. For example, the first protective layer 151 may have an opening exposing the surface of the fifth circuit pattern to be exposed among the fifth circuit patterns 145 disposed on the top surface of the second-third insulating layer 123.

Also, the second protective layer 152 may have an opening exposing the surface of the eighth circuit pattern to be exposed among the eighth circuit patterns 148 disposed on the bottom surface of the third-third insulating layer 133.

The first protective layer 151 and the second protective layer 152 may include an insulating material. The first protective layer 151 and the second protective layer 152 may include various materials that can be cured by heating after being applied to protect the surface of the circuit patterns. The first protective layer 151 and the second protective layer 152 may be resist layers. For example, the first protective layer 151 and the second protective layer 152 may be a solder resist layer including an organic polymer material. For example, the first protective layer 151 and the second protective layer 152 may include an epoxy acrylate-based resin. In detail, the first protective layer 151 and the second protective layer 152 may include a resin, a curing agent, a photo initiator, a pigment, a solvent, a filler, an additive, an acryl-based monomer, and the like. However, the embodiment is not limited thereto, and the first protective layer 151 and the second protective layer 152 may be any one of a photo solder resist layer, a cover-lay, and a polymer material.

A thickness of the first protective layer 151 and the second protective layer 152 may be 1 μm to 20 μm. The thickness of the first protective layer 151 and the second protective layer 152 may be 1 μm to 15 μm. For example, the thickness of the first protective layer 151 and the second protective layer 152 may be 5 μm to 20 μm. When the thickness of the first protective layer 151 and the second protective layer 151 is greater than 20 μm, the thickness of the circuit board may increase. When the thickness of the first protective layer 151 and the second protective layer 152 is less than 1 μm, the reliability of the circuit pattern may be deteriorated.

According to an embodiment, the circuit board includes a cavity. In addition, the cavity 160 of the circuit board has a non-penetrating structure rather than a structure penetrating the second insulating layer 120. In this case, the cavity 160 exposes the pad 141a disposed on a top surface of the first insulating layer 110. In this case, a bottom surface of the cavity 160 is positioned lower than the top surface of the pad. Accordingly, in the embodiment, it is not necessary to form an additional stop layer on the top surface of the first insulating layer to form the cavity 160, and accordingly, it may omit processes such as the formation and removal of the stop layer. In addition, the embodiment may solve the reliability problem due to the change in thickness or shape of the pad 141a that may occur in the process of removing the stop layer in the comparative example, and thereby improve product reliability.

In addition, the cavity of the circuit board of the embodiment includes a bottom surface and an inner wall. In this case, the inner wall of the cavity includes a first part extending from the bottom surface and having a first inclination angle; and a second part extending to the first part and having a second inclination angle. In this case, the first inclination angle and the second inclination angle are different from each other. In other words, the inner wall of the cavity of the embodiment may include an inflection point at which an inclination angle changes between the first part and the second part. In this case, each of the first inclination angle and the second inclination angle may mean an internal angle with the bottom surface. In addition, the first inclination angle may be smaller than the second inclination angle. Preferably, the second part of the inner wall constituting an outermost portion of the cavity of the embodiment may have a second inclination angle, and the first part of the inner wall may have a first inclination angle greater than the second inclination angle. The above embodiment can reduce the inclination angle of the second part of the inner wall compared to the comparative example, and accordingly when the same device is disposed, the embodiment may minimize a space required for forming a cavity compared to the comparative example, thereby improving circuit integration. In other words, the embodiment may reduce the inclination angle of the second portion of the inner wall, and accordingly, more circuits can be formed within the same area compared to the comparative example, and thus the overall volume of the circuit board can be reduced.

Features, structures, effects, etc. described in the above embodiments are included in at least one embodiment, and are not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and modifications should be interpreted as being included in the scope of the embodiments.

In the above, the embodiment has been mainly described, but this is only an example and does not limit the embodiment, those of ordinary skill in the art to which the embodiment pertains will appreciate that various modifications and applications not illustrated above are possible without departing from the essential characteristics of the present embodiment. For example, each component specifically shown in the embodiment can be implemented by modification. And differences related to such modifications and applications should be construed as being included in the scope of the embodiments set forth in the appended claims.

The invention claimed is:

1. A circuit board, comprising:
   a first insulating layer including an upper surface and a lower surface;
   a second insulating layer disposed on the first insulating layer and including a cavity;

a circuit pattern embedded in the second insulating layer;

a solder resist disposed on the second insulating layer and including a through hole; and an electric device disposed in the cavity of the second insulating layer, wherein the second insulating layer includes an inner wall surface forming the cavity, wherein the upper surface of the first insulating layer includes an overlapped surface that overlaps the cavity in a vertical direction, wherein the inner wall surface includes a first surface having a first inclination angle with respect to the overlapped surface, a second surface disposed on the first surface and having a second inclination angle different from the first inclination angle with respect to the overlapped surface, and a contact portion in which the first surface and the second surface are in contact, wherein the circuit pattern includes:

a first via electrode that overlaps the first surface of the cavity along a horizontal direction;

a second via electrode that is disposed on the first via electrode and does not overlap the first surface along the horizontal direction, and overlaps the second surface along the horizontal direction; and a wiring part that is disposed between the first via electrode and the second via electrode and does not overlap the first surface along the horizontal direction, and overlaps the second surface along the horizontal direction, wherein the wiring part is in contact the first via electrode and the second via electrode, wherein at least a portion of the through hole of the solder resist overlaps the cavity along the vertical direction, and wherein the electric device overlaps the first via electrode, the second via electrode, the wiring part, and the contact portion along the horizontal direction.

2. The circuit board of claim 1, further comprising:

a lower circuit layer disposed under the first insulating layer, wherein the lower circuit layer includes a lower via electrode, and a lower wiring layer connected to the lower via electrode, and wherein a thickness of the wiring part in the vertical direction is same as a thickness of the lower wiring layer in the vertical direction.

3. The circuit board of claim 2, wherein the contact portion overlaps the first via electrode along the horizontal direction.

4. The circuit board of claim 2, wherein the electric device is spaced apart from the first surface and the second surface along the horizontal direction.

5. The circuit board of claim 4, wherein the contact portion is a portion where inclination angles of the first surface and the second surface directly contact each other change.

6. The circuit board of claim 5, wherein the first via electrode is disposed closer to the first insulating layer than the contact portion.

7. The circuit board of claim 1, wherein the first inclination angle has an inclination angle between 130° and 160°, and wherein the second inclination angle has an inclination angle between 91° and 130°.

8. The circuit board of claim 1, wherein the first insulating layer and the second insulating layer are formed of a same material.

9. The circuit board of claim 1, wherein a thickness of the electronic device in the vertical direction is greater than a thickness of the first via electrode or the second via electrode in the vertical direction.

10. The circuit board of claim 1, wherein each of the first via electrode and the second via electrode gradually decreases in width as it approaches the first insulating layer.

11. A circuit board, comprising:

a first insulating layer including an upper surface and a lower surface;

a second insulating layer disposed on the first insulating layer and including a cavity;

a circuit pattern embedded in the second insulating layer;

an electric device disposed in the cavity of the second insulating layer; and a solder resist disposed on the second insulating layer and including a through hole, wherein the second insulating layer includes an inner wall surface forming the cavity, wherein the upper surface of the first insulating layer includes an overlapped surface that overlaps the cavity in a vertical direction, wherein the inner wall surface includes a first surface having a first inclination angle with respect to the overlapped surface, a second surface disposed on the first surface and having a second inclination angle smaller than the first inclination angle with respect to the overlapped surface, and a contact portion in which the first surface and the second surface are in contact, wherein the circuit pattern includes:

a first via electrode that overlaps the first surface of the cavity along a horizontal direction;

a second via electrode that is disposed on the first via electrode and does not overlap the first surface along the horizontal direction, and overlaps the second surface along the horizontal direction; and a wiring part that is disposed between the first via electrode and the second via electrode and does not overlap the first surface along the horizontal direction, and overlaps the second surface along the horizontal direction, wherein the wiring part is in contact the first via electrode and the second via electrode, wherein at least a portion of the through hole of the solder resist overlaps the cavity along the vertical direction, wherein the first inclination angle and the second inclination angle exceed 90 degree with respect to the overlapped surface, and wherein the electric device overlaps the first via electrode, the second via electrode, the wiring part, the first surface, the second surface, and the contact portion along the horizontal direction.

12. The circuit board of claim 11, wherein the contact portion is a portion where inclination angles of the first surface and the second surface directly contact each other change.

13. The package substrate of claim 12, wherein a thickness of the electronic device in a vertical direction is greater than a thickness of the first via electrode or the second via electrode in the vertical direction.

14. The package substrate of claim 11, wherein the first inclination angle has an inclination angle between 130° and 160°, and wherein the second inclination angle has an inclination angle between 91° and 130°.

15. The package substrate of claim 13, further comprising:

a lower circuit layer disposed under the first insulating layer, wherein the lower circuit layer includes a lower via electrode, and a lower wiring layer connected to the lower via electrode, and wherein a thickness of the wiring part in the vertical direction is same as a thickness of the lower wiring layer in the vertical direction.

16. The package substrate of claim 15, wherein the contact portion overlaps with the first via electrode along the horizontal direction.

17. The package substrate of claim 12, wherein the first via electrode is disposed closer to the first insulating layer than the contact portion.

* * * * *